(12) United States Patent
Chan

(10) Patent No.: US 7,447,081 B2
(45) Date of Patent: Nov. 4, 2008

(54) METHODS FOR IMPROVED PROGRAM-VERIFY OPERATIONS IN NON-VOLATILE MEMORIES

(75) Inventor: Siu Lung Chan, San Jose, CA (US)

(73) Assignee: Sandisk Corporation, Milpitas, CA (US)

( * ) Notice: Subject to any disclaimer, the term of this patent is extended or adjusted under 35 U.S.C. 154(b) by 0 days.

(21) Appl. No.: 11/753,327

(22) Filed: May 24, 2007

(65) Prior Publication Data

US 2007/0230250 A1   Oct. 4, 2007

Related U.S. Application Data

(62) Division of application No. 11/323,596, filed on Dec. 29, 2005, now Pat. No. 7,224,614.

(51) Int. Cl.
   *G11C 16/06* (2006.01)
(52) U.S. Cl. .............................. 365/185.22; 365/185.03; 365/185.17; 365/185.2; 365/185.24
(58) Field of Classification Search ............ 365/185.22, 365/185.03, 185.17, 185.2, 185.24
   See application file for complete search history.

(56) References Cited

U.S. PATENT DOCUMENTS

| 4,357,685 | A | 11/1982 | Daniele et al. |
|---|---|---|---|
| 5,070,032 | A | 12/1991 | Yuan et al. |
| 5,095,344 | A | 3/1992 | Harari |
| 5,163,021 | A | 11/1992 | Mehrotra et al. |
| 5,172,338 | A | 12/1992 | Mehrotra et al. |
| 5,313,421 | A | 5/1994 | Guterman et al. |
| 5,315,541 | A | 5/1994 | Harari et al. |
| 5,343,063 | A | 8/1994 | Yuan et al. |
| 5,418,752 | A | 5/1995 | Harari et al. |
| 5,532,962 | A | 7/1996 | Auclair et al. |
| 5,570,315 | A | 10/1996 | Tanaka et al. |
| 5,595,924 | A | 1/1997 | Yuan et al. |
| 5,596,526 | A * | 1/1997 | Assar et al. ............ 365/185.17 |
| 5,657,332 | A | 8/1997 | Auclair et al. |
| 5,661,053 | A | 8/1997 | Yuan |
| 5,768,192 | A | 6/1998 | Eitan |

(Continued)

OTHER PUBLICATIONS

Eitan et al., "NROM: A Novel Localized Trapping, 2-Bit Nonvolatile Memory Cell," IEEE Electron Device Letters, vol. 21, No. 11, Nov. 2000, pp. 543-545.

(Continued)

*Primary Examiner*—Viet Q Nguyen
(74) *Attorney, Agent, or Firm*—Davis Wright Tremaine LLP

(57) ABSTRACT

In programming a non-volatile memory involving alternately applying a programming pulse and verifying the programming, time is saved in the program verify portion when, depending on the states of the memory cells, a portion of the verify operation is recognized to be superfluous and skipped. Preferably, in a program verify operation relative to a demarcation threshold level for demarcating between two memory states, the verify operation includes a sequence of two verify sub-cycles, the first sub-cycle performing a verify relative to a first threshold level at a predetermined margin below the demarcation threshold level and the second sub-cycle performing a verify relative to a second threshold level which is identical to the demarcation threshold level. Unlike conventional cases, the second sub-cycle is not performed until any one memory cell of the group has been verified to pass the first threshold.

9 Claims, 24 Drawing Sheets

U.S. PATENT DOCUMENTS

| | | | |
|---|---|---|---|
| 5,774,397 | A | 6/1998 | Endoh et al. |
| 5,903,495 | A | 5/1999 | Takeuchi et al. |
| 6,011,725 | A | 1/2000 | Eitan |
| 6,046,935 | A | 4/2000 | Takeuchi et al. |
| 6,222,762 | B1 | 4/2001 | Guterman et al. |
| 6,584,017 | B2 * | 6/2003 | Maayan et al. ......... 365/185.22 |
| 6,618,297 | B1 | 9/2003 | Manea |
| 6,643,188 | B2 | 11/2003 | Tanaka et al. |
| 6,657,891 | B1 | 12/2003 | Shibata et al. |
| 6,738,289 | B2 | 5/2004 | Gongwer et al. |
| 6,856,546 | B2 * | 2/2005 | Guterman et al. ........ 365/185.2 |
| 6,894,926 | B2 * | 5/2005 | Guterman et al. ...... 365/185.03 |
| 7,023,736 | B2 | 4/2006 | Cernea et al. |
| 7,046,568 | B2 | 5/2006 | Cernea |
| 7,064,983 | B2 * | 6/2006 | Maayan et al. ........... 365/185.2 |
| 7,073,103 | B2 | 7/2006 | Gongwer et al. |
| 7,139,465 | B2 | 11/2006 | Gongwer et al. |
| 7,173,854 | B2 | 2/2007 | Cernea et al. |
| 7,224,614 | B1 * | 5/2007 | Chan ..................... 365/185.22 |
| 7,310,255 | B2 * | 12/2007 | Chan ........................... 365/22 |
| 2004/0057318 | A1 | 3/2004 | Cernea et al. |
| 2004/0109357 | A1 | 6/2004 | Cernea et al. |
| 2005/0162916 | A1 | 7/2005 | Guterman |
| 2005/0162923 | A1 | 7/2005 | Guterman |
| 2005/0169082 | A1 | 8/2005 | Cernea |
| 2005/0226055 | A1 | 10/2005 | Guterman et al. |
| 2005/0237814 | A1 | 10/2005 | Li et al. |
| 2005/0248988 | A1 | 11/2005 | Guterman |
| 2006/0140007 | A1 | 6/2006 | Cernea et al. |
| 2006/0268619 | A1 | 11/2006 | Chen |
| 2007/0171725 | A1 * | 7/2007 | Chan ..................... 365/185.22 |

OTHER PUBLICATIONS

ISA/EPO, "Notification of Transmittal of the International Search Report and the Written Opinion of the International Searching Authority, or the Declaration," mailed in related International Application No. PCT/US2006/062627 on Jun. 27, 2007, 11 pages.

USPTO, "Notice of Allowance and Fee(s) Due," mailed in related U.S. Appl. No. 11/323,577, filed Oct. 10, 2007, 22 pages.

USPTO, "Office Action," mailed in related U.S. Appl. No. 11/955,624 on Jun. 13, 2008, 21 pages.

* cited by examiner

FIG. 3     (Prior Art)

Multistate Memory (Conventional Gray Code)

Lower Page Programming (Conventional Gray Code)

Upper Page Programming (Conventional Gray Code)

Lower Page Read (Conventional Gray Code)

Upper Page Read (Conventional Gray Code)

Multistate Memory (LM Gray Code)

Lower Page Programming (LM Gray Code)

Upper Page Programming (LM Gray Code)

Lower Page Read (LM Gray Code)

Upper Page Read (LM Gray Code)

Multistate Memory (LM New Code)

Lower Page Programming (LM New Code)

Upper Page Programming (LM New Code)

Lower Page Read (LM New Code)

Upper Page Read (LM New Code)

Two-Pass Programming

Two-Pass Programming

One-Pass (QPW) Programming

One-Pass (QPW) Programming

Shortened Cycle of SQPW Verify

Extended Cycle of SQPW Verify

Normal Cycle of SQPW Verify

Multi-level SQPW Verify (initial stage with only VerifyA)

Multi-level SQPW Verify
(intermediate stage with VerifyA and VerifyB)

Multi-level SQPW Verify
(Final stage with VerifyA, VerifyB and VerifyC)

METHODS FOR IMPROVED PROGRAM-VERIFY OPERATIONS IN NON-VOLATILE MEMORIES

CROSS REFERENCE TO RELATED APPLICATION

This application is a divisional of application Ser. No. 11/323,596, filed on Dec. 29, 2005, now U.S. Pat. No. 7,224,614 which applications are incorporated herein in their entirety by this reference. This application is also related to application Ser. No. 11/323,577, now U.S. Pat. No. 7,310,255 filed on Dec. 29, 2005, which applications are incorporated herein in their entirety by this reference.

FIELD OF THE INVENTION

This invention relates generally to non-volatile semiconductor memory such as electrically erasable programmable read-only memory (EEPROM) and flash EEPROM, and specifically ones implementing time-saving features during program verify operations.

BACKGROUND OF THE INVENTION

Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile, and retaining its stored data even after power is turned off. In spite of the higher cost flash memory is increasingly being used in mass storage applications. Conventional mass storage, based on rotating magnetic medium such as hard drives and floppy disks, is unsuitable for the mobile and handheld environment. This is because disk drives tend to be bulky, are prone to mechanical failure and have high latency and high power requirements. These undesirable attributes make disk-based storage impractical in most mobile and portable applications. On the other hand, flash memory, both embedded and in the form of a removable card are ideally suited in the mobile and handheld environment because of its small size, low power consumption, high speed and high reliability features.

EEPROM and electrically programmable read-only memory (EPROM) are non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

The transistor serving as a memory cell is typically programmed to a "programmed" state by one of two mechanisms. In "hot electron injection" a high voltage applied to the drain accelerates electrons across the substrate channel region. At the same time a high voltage applied to the control gate pulls the hot electrons through a thin gate dielectric onto the floating gate. In "tunneling injection," a high voltage is applied to the control gate relative to the substrate. In this way, electrons are pulled from the substrate to the intervening floating gate.

The memory device may be erased by a number of mechanisms. For EPROM, the memory is bulk erasable by removing the charge from the floating gate by ultraviolet radiation. For EEPROM, a memory cell is electrically erasable, by applying a high voltage to the substrate relative to the control gate so as to induce electrons in the floating gate to tunnel through a thin oxide to the substrate channel region (i.e., Fowler-Nordheim tunneling.) Typically, the EEPROM is erasable byte by byte. For flash EEPROM, the memory is electrically erasable either all at once or one or more blocks at a time, where a block may consist of 512 bytes or more of memory.

Examples of Non-Volatile Memory Cells

The memory devices typically comprise one or more memory chips that may be mounted on a card. Each memory chip comprises an array of memory cells supported by peripheral circuits such as decoders and erase, write and read circuits. The more sophisticated memory devices also come with a controller that performs intelligent and higher level memory operations and interfacing. There are many commercially successful non-volatile solid-state memory devices being used today. These memory devices may employ different types of memory cells, each type having one or more charge storage element.

FIGS. 1A-1E illustrate schematically different examples of non-volatile memory cells.

FIG. 1A illustrates schematically a non-volatile memory in the form of an EEPROM cell with a floating gate for storing charge. An electrically erasable and programmable read-only memory (EEPROM) has a similar structure to EPROM, but additionally provides a mechanism for loading and removing charge electrically from its floating gate upon application of proper voltages without the need for exposure to UV radiation. Examples of such cells and methods of manufacturing them are given in U.S. Pat. No. 5,595,924.

FIG. 1B illustrates schematically a flash EEPROM cell having both a select gate and a control or steering gate. The memory cell 10 has a "split-channel" 12 between source 14 and drain 16 diffusions. A cell is formed effectively with two transistors T1 and T2 in series. T1 serves as a memory transistor having a floating gate 20 and a control gate 30. The floating gate is capable of storing a selectable amount of charge. The amount of current that can flow through the T1's portion of the channel depends on the voltage on the control gate 30 and the amount of charge residing on the intervening floating gate 20. T2 serves as a select transistor having a select gate 40. When T2 is turned on by a voltage at the select gate 40, it allows the current in the T1's portion of the channel to pass between the source and drain. The select transistor provides a switch along the source-drain channel independent of the voltage at the control gate. One advantage is that it can be used to turn off those cells that are still conducting at zero control gate voltage due to their charge depletion (positive) at their floating gates. The other advantage is that it allows source side injection programming to be more easily implemented.

One simple embodiment of the split-channel memory cell is where the select gate and the control gate are connected to the same word line as indicated schematically by a dotted line shown in FIG. 1B. This is accomplished by having a charge storage element (floating gate) positioned over one portion of the channel and a control gate structure (which is part of a word line) positioned over the other channel portion as well as over the charge storage element. This effectively forms a cell with two transistors in series, one (the memory transistor) with a combination of the amount of charge on the charge storage element and the voltage on the word line controlling the amount of current that can flow through its portion of the channel, and the other (the select transistor) having the word line alone serving as its gate. Examples of such cells, their uses in memory systems and methods of manufacturing them are given in U.S. Pat. Nos. 5,070,032, 5,095,344, 5,315,541, 5,343,063, and 5,661,053.

A more refined embodiment of the split-channel cell shown in FIG. 1B is when the select gate and the control gate are independent and not connected by the dotted line between them. One implementation has the control gates of one column in an array of cells connected to a control (or steering) line perpendicular to the word line. The effect is to relieve the word line from having to perform two functions at the same time when reading or programming a selected cell. Those two functions are (1) to serve as a gate of a select transistor, thus requiring a proper voltage to turn the select transistor on and off, and (2) to drive the voltage of the charge storage element to a desired level through an electric field (capacitive) coupling between the word line and the charge storage element. It is often difficult to perform both of these functions in an optimum manner with a single voltage. With the separate control of the control gate and the select gate, the word line need only perform function (1), while the added control line performs function (2). This capability allows for design of higher performance programming where the programming voltage is geared to the targeted data. The use of independent control (or steering) gates in a flash EEPROM array is described, for example, in U.S. Pat. Nos. 5,313,421 and 6,222,762.

FIG. 1C illustrates schematically another flash EEPROM cell having dual floating gates and independent select and control gates. The memory cell 10 is similar to that of FIG. 1B except it effectively has three transistors in series. In this type of cell, two storage elements (i.e., that of T1-left and T1-right) are included over its channel between source and drain diffusions with a select transistor T1 in between them. The memory transistors have floating gates 20 and 20', and control gates 30 and 30', respectively. The select transistor T2 is controlled by a select gate 40. At any one time, only one of the pair of memory transistors is accessed for read or write. When the storage unit T1-left is being accessed, both the T2 and T1-right are turned on to allow the current in the T1-left's portion of the channel to pass between the source and the drain. Similarly, when the storage unit T1-right is being accessed, T2 and T1-left are turned on. Erase is effected by having a portion of the select gate polysilicon in close proximity to the floating gate and applying a substantial positive voltage (e.g. 20V) to the select gate so that the electrons stored within the floating gate can tunnel to the select gate polysilicon.

FIG. 1D illustrates schematically a string of memory cells organized into an NAND cell. An NAND cell 50 consists of a series of memory transistors M1, M2, . . . Mn (n=4, 8, 16 or higher) daisy-chained by their sources and drains. A pair of select transistors S1, S2 controls the memory transistors chain's connection to the external via the NAND cell's source terminal 54 and drain terminal 56. In a memory array, when the source select transistor S1 is turned on, the source terminal is coupled to a source line. Similarly, when the drain select transistor S2 is turned on, the drain terminal of the NAND cell is coupled to a bit line of the memory array. Each memory transistor in the chain has a charge storage element to store a given amount of charge so as to represent an intended memory state. A control gate of each memory transistor provides control over read and write operations. A control gate of each of the select transistors S1, S2 provides control access to the NAND cell via its source terminal 54 and drain terminal 56 respectively.

When an addressed memory transistor within an NAND cell is read and verified during programming, its control gate is supplied with an appropriate voltage. At the same time, the rest of the non-addressed memory transistors in the NAND cell 50 are fully turned on by application of sufficient voltage on their control gates. In this way, a conductive path is effective created from the source of the individual memory transistor to the source terminal 54 of the NAND cell and likewise for the drain of the individual memory transistor to the drain terminal 56 of the cell. Memory devices with such NAND cell structures are described in U.S. Pat. Nos. 5,570,315, 5,903,495, 6,046,935.

FIG. 1E illustrates schematically a nonvolatile memory with a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric.

Memory Array

A memory device typically comprises of a two-dimensional array of memory cells arranged in rows and columns and addressable by word lines and bit lines. The array can be formed according to an NOR type or an NAND type architecture.

NOR Array

FIG. 2 illustrates an example of an NOR array of memory cells. Memory devices with an NOR type architecture have been implemented with cells of the type illustrated in FIG. 1B or 1C. Each row of memory cells are connected by their sources and drains in a daisy-chain manner. This design is sometimes referred to as a virtual ground design. Each memory cell 10 has a source 14, a drain 16, a control gate 30 and a select gate 40. The cells in a row have their select gates connected to word line 42. The cells in a column have their sources and drains respectively connected to selected bit lines 34 and 36. In some embodiments where the memory cells have their control gate and select gate controlled independently, a steering line 36 also connects the control gates of the cells in a column.

Many flash EEPROM devices are implemented with memory cells where each is formed with its control gate and select gate connected together. In this case, there is no need for steering lines and a word line simply connects all the control gates and select gates of cells along each row. Examples of these designs are disclosed in U.S. Pat. Nos. 5,172,338 and 5,418,752. In these designs, the word line essentially performed two functions: row selection and supplying control gate voltage to all cells in the row for reading or programming.

NAND Array

FIG. 3 illustrates an example of an NAND array of memory cells, such as that shown in FIG. 1D. Along each column of NAND chains, a bit line is coupled to the drain terminal 56 of each NAND chain. Along each row of NAND chains, a source line may connect all their source terminals 54. Also the control gates of the NAND chains along a row are connected to a series of corresponding word lines. An entire row of NAND chains can be addressed by turning on the pair of select transistors (see FIG. 1D) with appropriate voltages on their control gates via the connected word lines. When a memory transistor representing a memory cell within the NAND chain is being read, the remaining memory transistors in the chain are turned on hard via their associated word lines so that the current flowing through the chain is essentially dependent upon the level of charge stored in the cell being read. An example of an NAND architecture array and its operation as part of a memory system is found in U.S. Pat. Nos. 5,570,315, 5,774,397 and 6,046,935.

Program and Program Inhibit

In the case of programming a NAND memory, a programming voltage pulse is applied to the word line connecting to the page of selected memory cells. Within the page, those memory cells that are to be programmed have their bit line voltage set to 0V while the other memory cells not to be programmed have their bit line voltage set to a system supply voltage Vdd in order to inhibit programming. Setting the bit line to Vdd will effectively turn off the select transistor at the drain side of the NAND chain and result in a floated channel. During programming the voltage at the floated channel will be boosted by the high word line voltages. This will effectively reduce the potential difference between the channel and the charge storage unit, thereby discouraging pulling electrons from the channel to the charge storage unit to effect programming.

Block Erase

Programming of charge storage memory devices can only result in adding more charge to its charge storage elements. Therefore, prior to a program operation, existing charge in a charge storage element must be removed (or erased). Erase circuits (not shown) are provided to erase one or more blocks of memory cells. A non-volatile memory such as EEPROM is referred to as a "Flash" EEPROM when an entire array of cells, or significant groups of cells of the array, is electrically erased together (i.e., in a flash). Once erased, the group of cells can then be reprogrammed. The group of cells erasable together may consist of one or more addressable erase unit. The erase unit or block typically stores one or more pages of data, the page being the unit of programming and reading, although more than one page may be programmed or read in a single operation. Each page typically stores one of more sectors of data, the size of the sector being defined by the host system. An example is a sector of 512 bytes of user data, following a standard established with magnetic disk drives, plus some number of bytes of overhead information about the user data and/or the block in with it is stored.

Read/Write Circuits

In the usual two-state EEPROM cell, at least one current breakpoint level is established so as to partition the conduction window into two regions. When a cell is read by applying predetermined, fixed voltages, its source/drain current is resolved into a memory state by comparing with the breakpoint level (or reference current $I_{REF}$). If the current read is higher than that of the breakpoint level, the cell is determined to be in one logical state (e.g., a "zero" state). On the other hand, if the current is less than that of the breakpoint level, the cell is determined to be in the other logical state (e.g., a "one" state). Thus, such a two-state cell stores one bit of digital information. A reference current source, which may be externally programmable, is often provided as part of a memory system to generate the breakpoint level current.

In order to increase memory capacity, flash EEPROM devices are being fabricated with higher and higher density as the state of the semiconductor technology advances. Another method for increasing storage capacity is to have each memory cell store more than two states.

For a multi-state or multi-level EEPROM memory cell, the conduction window is partitioned into more than two regions by more than one breakpoint such that each cell is capable of storing more than one bit of data. The information that a given EEPROM array can store is thus increased with the number of states that each cell can store. EEPROM or flash EEPROM with multi-state or multi-level memory cells have been described in U.S. Pat. No. 5,172,338.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current. In one implementation the detection of the conduction current relative to a threshold current is accomplished by examining the rate the conduction current is discharging through the capacitance of the bit line.

FIG. 4 illustrates the relation between the source-drain current $I_D$ and the control gate voltage $V_{CG}$ for four different charges Q1-Q4 that the floating gate may be selectively storing at any one time. The four solid $I_D$ versus $V_{CG}$ curves represent four possible charge levels that can be programmed on a floating gate of a memory cell, respectively corresponding to four possible memory states. As an example, the threshold voltage window of a population of cells may range from 0.5V to 3.5V. Six memory states may be demarcated by partitioning the threshold window into five regions in interval of 0.5V each. For example, if a reference current, $I_{REF}$ of 2 μA is used as shown, then the cell programmed with Q1 may be considered to be in a memory state "1" since its curve intersects with $I_{REF}$ in the region of the threshold window demarcated by $V_{CG}$=0.5V and 1.0V. Similarly, Q4 is in a memory state "5".

As can be seen from the description above, the more states a memory cell is made to store, the more finely divided is its threshold window. This will require higher precision in programming and reading operations in order to be able to achieve the required resolution.

U.S. Pat. No. 4,357,685 discloses a method of programming a 2-state EPROM in which when a cell is programmed to a given state, it is subject to successive programming voltage pulses, each time adding incremental charge to the floating gate. In between pulses, the cell is read back or verified to determine its source-drain current relative to the breakpoint level. Programming stops when the current state has been verified to reach the desired state. The programming pulse train used may have increasing period or amplitude.

Prior art programming circuits simply apply programming pulses to step through the threshold window from the erased or ground state until the target state is reached. Practically, to allow for adequate resolution, each partitioned or demarcated region would require at least about five programming steps to transverse. The performance is acceptable for 2-state memory cells. However, for multi-state cells, the number of steps required increases with the number of partitions and therefore, the programming precision or resolution must be increased. For example, a 16-state cell may require on average at least 40 programming pulses to program to a target state.

FIG. 5 illustrates schematically a memory device with a typical arrangement of a memory array 100 accessible by read/write circuits 170 via row decoder 130 and column decoder 160. As described in connection with FIGS. 2 and 3, a memory transistor of a memory cell in the memory array 100 is addressable via a set of selected word line(s) and bit line(s). The row decoder 130 selects one or more word lines mid the column decoder 160 selects one or more bit lines in order to apply appropriate voltages to the respective gates of the addressed memory transistor. Read/write circuits 170 are provided to read or write (program) the memory states of addressed memory transistors. The read/write circuits 170 comprise a number of read/write modules connectable via bit lines to memory elements in the array.

Factors Affecting Read/Write Performance and Accuracy

In order to improve read and program performance, multiple charge storage elements or memory transistors in an array are read or programmed in parallel. Thus, a logical "page" of memory elements are read or programmed together. In existing memory architectures, a row typically contains several interleaved pages. All memory elements of a page will be read or programmed together. The column decoder will selectively connect each one of the interleaved pages to a corresponding number of read/write modules. For example, in one implementation, the memory array is designed to have a page size of 532 bytes (512 bytes plus 20 bytes of overheads.) If each column contains a drain bit line and there are two interleaved pages per row, this amounts to 8512 columns with each page being associated with 4256 columns. There will be 4256 sense modules connectable to read or write in parallel either all the even bit lines or the odd bit lines. In this way, a page of 4256 bits (i.e., 532 bytes) of data in parallel are read from or programmed into the page of memory elements. The read/write modules forming the read/write circuits 170 can be arranged into various architectures.

As mentioned before, conventional memory devices improve read/write operations by operating in a massively parallel manner on all even or all odd bit lines at a time. This "alternate-bit-line" architecture of a row consisting of two interleaved pages will help to alleviate the problem of fitting the block of read/write circuits. It is also dictated by consideration of controlling bit-line to bit-line capacitive coupling. A block decoder is used to multiplex the set of read/write modules to either the even page or the odd page. In this way, whenever one set bit lines are being read or programmed, the interleaving set can be grounded to minimize immediate neighbor coupling.

However, the interleaving page architecture is disadvantageous in at least three respects. First, it requires additional multiplexing circuitry. Secondly, it is slow in performance. To finish read or program of memory cells connected by a word line or in a row, two read or two program operations are required. Thirdly, it is also not optimum in addressing other disturb effects such as field coupling between neighboring charge storage elements at the floating gate level when the two neighbors are programmed at different times, such as separately in odd and even pages.

United States Patent Publication No. 2004-0057318-A1 discloses a memory device and a method thereof that allow sensing a plurality of contiguous memory cells in parallel. For example, all memory cells along a row sharing the same word lines are read or programmed together as a page. This "all-bit-line" architecture doubles the performance of the "alternate-bit-line" architecture while minimizing errors caused by neighboring disturb effects. However, sensing all bit lines does bring up the problem of cross-talk between neighboring bit lines due induced currents from their mutual capacitance. This is addressed by keeping the voltage difference between each adjacent pair of bit lines substantially independent of time while their conduction currents are being sensed. When this condition is imposed, all displacement currents due to the various bit lines' capacitance drop out since they all depend on a time varying voltage difference. The sensing circuit coupled to each bit line has a voltage clamp on the bit line so that the potential difference on any adjacent pair of connected bit lines is time-independent. With the bit line voltage clamped, the conventional method of sensing the discharge due to the bit line capacitance can not be applied. Instead, the sensing circuit and method allow determination of a memory cell's conduction current by noting the rate it discharges or charges a given capacitor independent of the bit line. This will allow a sensing circuit independent of the architecture of the memory array (i.e., independent of the bit line capacitance.) Especially, it allows the bit line voltages to be clamped during sensing in order to avoid bit line crosstalk.

An important aspect in the performance of non-volatile memories is programming speed. A program operation typically includes alternate cycles of applying a programming pulse followed by sensing to program verify if a memory cell has been programmed to an intended state.

Therefore there is a general need for high performance and high capacity non-volatile memory with improved performance. In particular, there is a need for improving program performance including improving program verify operations.

SUMMARY OF INVENTION

According to the present invention, depending on the states of the memory cells being sensed during a program verify operation, a portion of the verify operation is recognized to be superfluous and skipped to save time. In a preferred embodiment, in a program verify operation on a group of memory cells being programmed in parallel and involving verifying relative to a given threshold level for demarcating between two memory states, the verify operation includes a sequence of two verify sub-cycles, the first sub-cycle performing a verify relative to a first threshold level at a predetermined margin below the given threshold level and the second subcycle performing a verify relative to a second threshold level which is identical to the given threshold level. However, unlike conventional cases, the second sub-cycle is not performed until any one memory cell of the group has been verified to pass the first threshold.

In a preferred embodiment, an operation, referred to as "One-bit-Pass" ("OBP") is performed at the end of the first sub-cycle to check for the event if any one memory cell of the group has been programmed past the first threshold level. In that event, subsequent verify cycle would no longer require the OBP but would include the second sub-cycle.

Additional features and advantages of the present invention will be understood from the following description of its preferred embodiments, which description should be taken in conjunction with the accompanying drawings.

DETAILED DESCRIPTION OF THE PREFERRED EMBODIMENTS

Figure 6A:
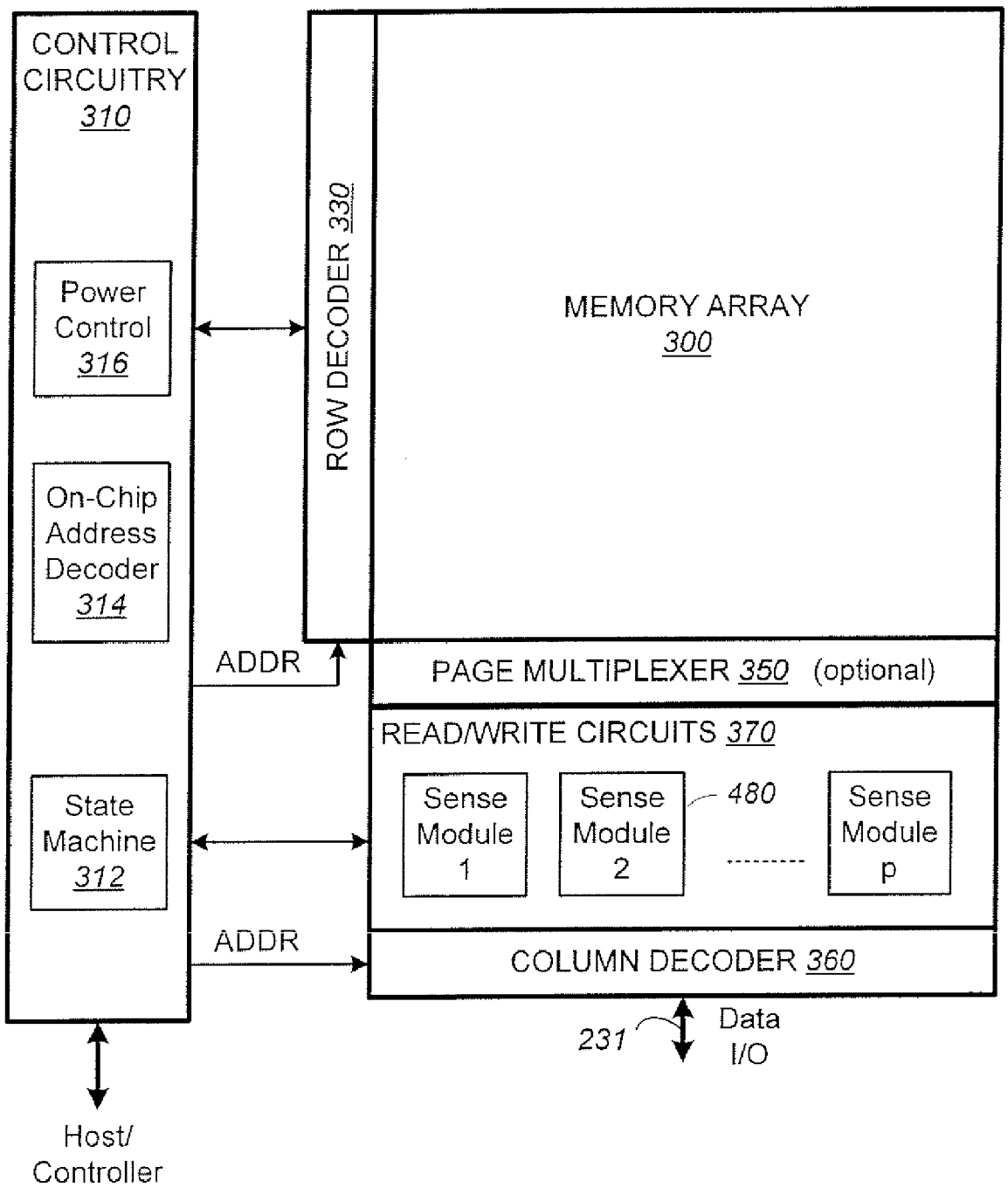
FIG. 6A illustrates schematically a compact memory device having, a bank of read/write circuits, which provides the context in which the present invention is implemented.

FIG. 6A illustrates schematically a compact memory device having a bank of read/write circuits, which provides the context in which the present invention is implemented. The memory device includes a two-dimensional array of memory cells 300, control circuitry 310, and read/write circuits 370. The memory array 300 is addressable by word lines via a row decoder 330 and by bit lines via a column decoder 360. The read/write circuits 370 is implemented as a bank of sense modules 480 and allows a block (also referred to as a "page") of memory cells to be read or programmed in parallel. In a preferred embodiment, a page is constituted from a contiguous row of memory cells. In another embodiment, where a row of memory cells are partitioned into multiple blocks or pages, a block multiplexer 350 is provided to multiplex the read/write circuits 370 to the individual blocks.

The control circuitry 310 cooperates with the read/write circuits 370 to perform memory operations on the memory array 300. The control circuitry 310 includes a state machine 312, an on-chip address decoder 314 and a power control module 316. The state machine 312 provides chip level control of memory operations. The on-chip address decoder 314 provides an address interface between that used by the host or a memory controller to the hardware address used by the decoders 330 and 370. The power control module 316 controls the power and voltages supplied to the word lines and bit lines during memory operations.

Figure 6B:
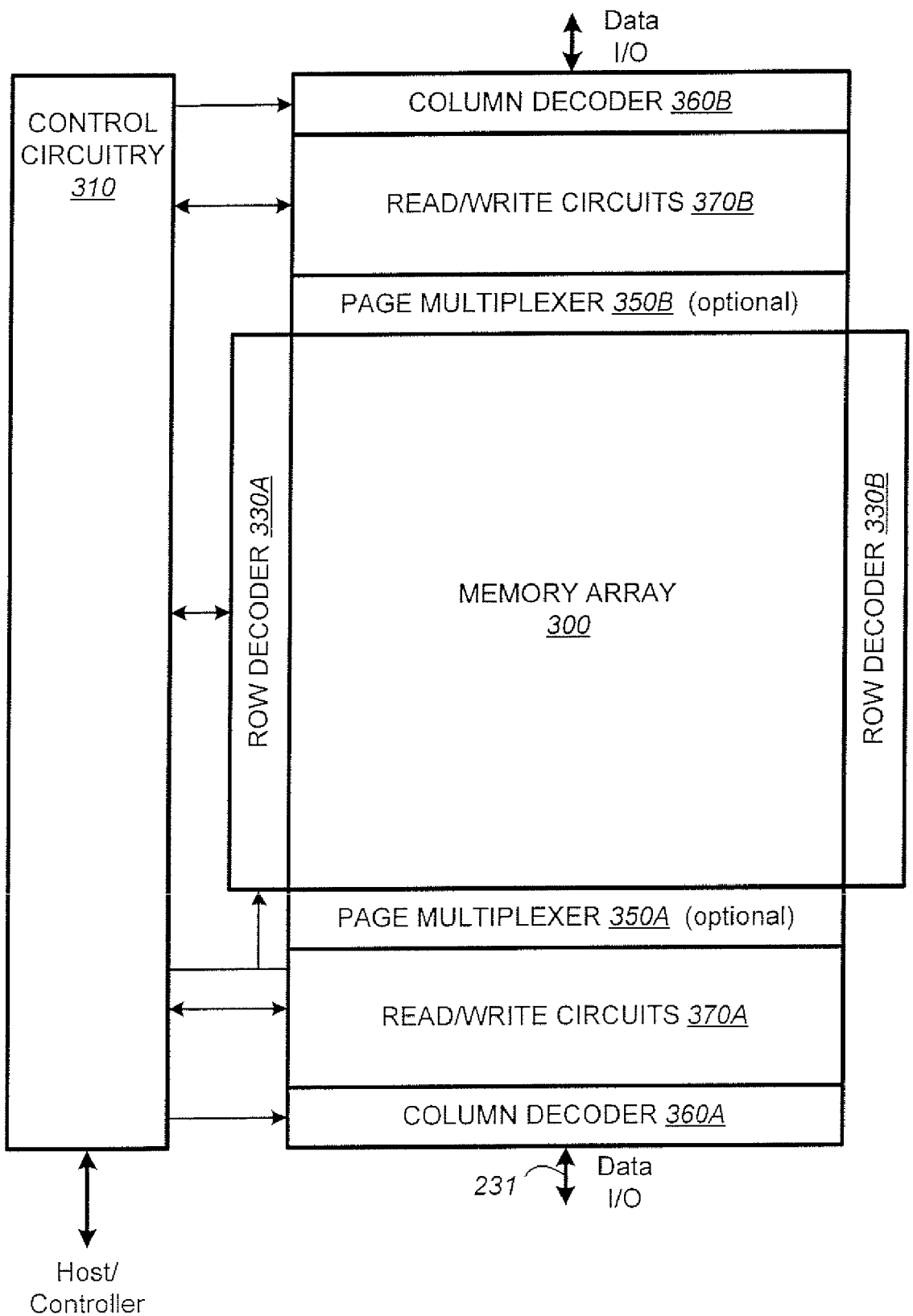
FIG. 6B illustrates a preferred arrangement of the compact memory device shown in FIG. 6A.

FIG. 6B illustrates a preferred arrangement of the compact memory device shown in FIG. 6A. Access to the memory array 300 by the various peripheral circuits is implemented in a symmetric fashion, on opposite sides of the array so that access lines and circuitry on each side are reduced in half. Thus, the row decoder is split into row decoders 330A and 330B and the column decoder into column decoders 360A and 360B. In the embodiment where a row of memory cells are partitioned into multiple blocks, the block multiplexer 350 is split into block multiplexers 350A and 350B. Similarly, the read/write circuits are split into read/write circuits 370A connecting to bit lines from the bottom and read/write circuits 370B connecting to bit lines from the top of the array 300. In this way, the density of the read/write modules, and therefore that of the bank of sense modules 480, is essentially reduced by one half.

The entire bank of p sense modules 480 operating in parallel allows a block (or page) of p cells along a row to be read or programmed in parallel. One example memory array may have p=512 bytes (512×8 bits). In the preferred embodiment, the block is a run of the entire row of cells. In another embodiment, the block is a subset of cells in the row. For example, the subset of cells could be one half of the entire row or one quarter of the entire row. The subset of cells could be a run of contiguous cells or one every other cell, or one every predetermined number of cells. Each sense module includes a sense amplifier for sensing the conduction current of a memory cell.

Figure 6C:
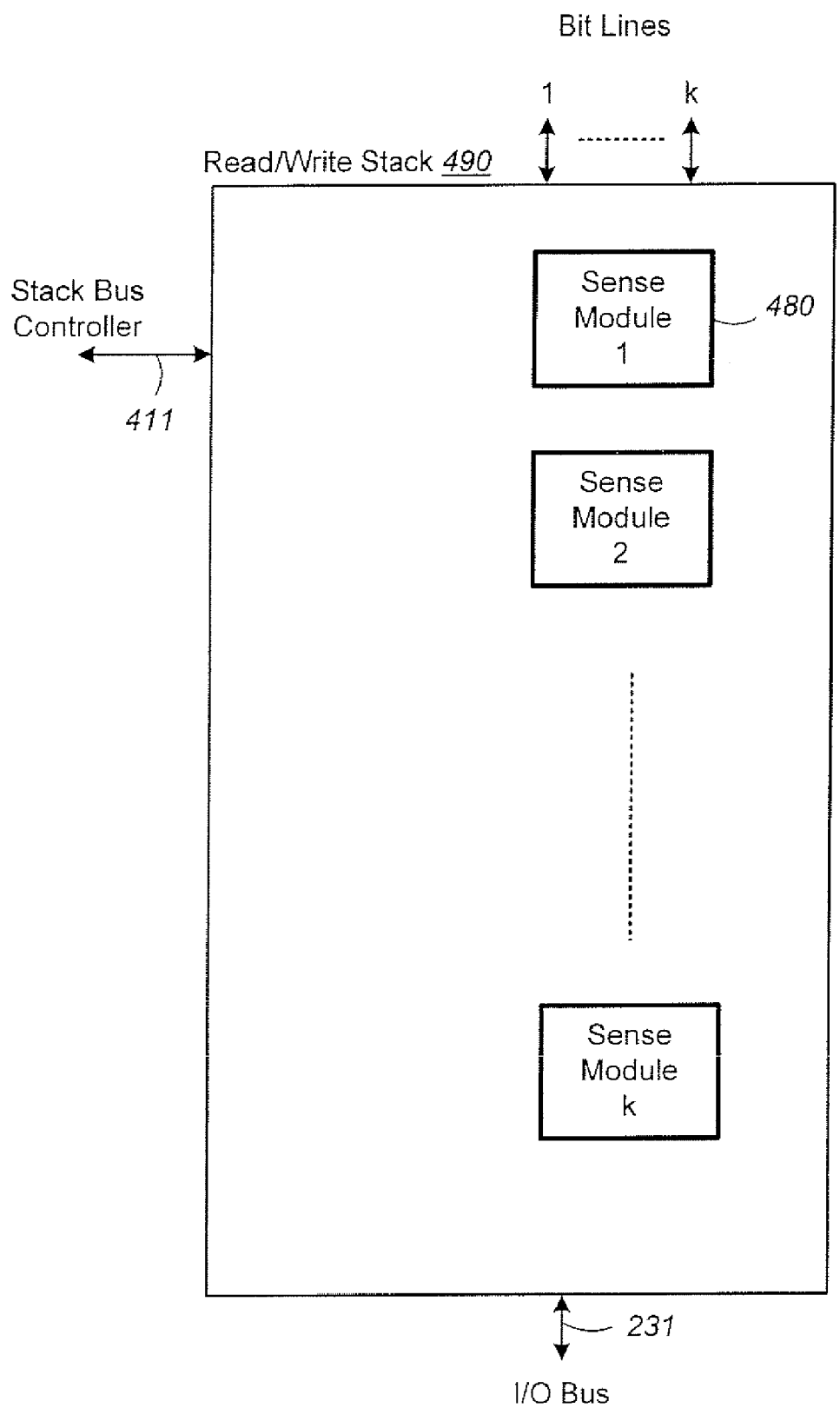
FIG. 6C illustrates a preferred grouping of a number of sense modules into a read/write stack.

FIG. 6C illustrates a preferred grouping of a number of sense modules into a read/write stack. The read/write stack 490 allows a group of sense modules shown in FIG. 6A to be implemented in a space efficient manner with common components among the sense modules to be factored out.

Figure 6D:
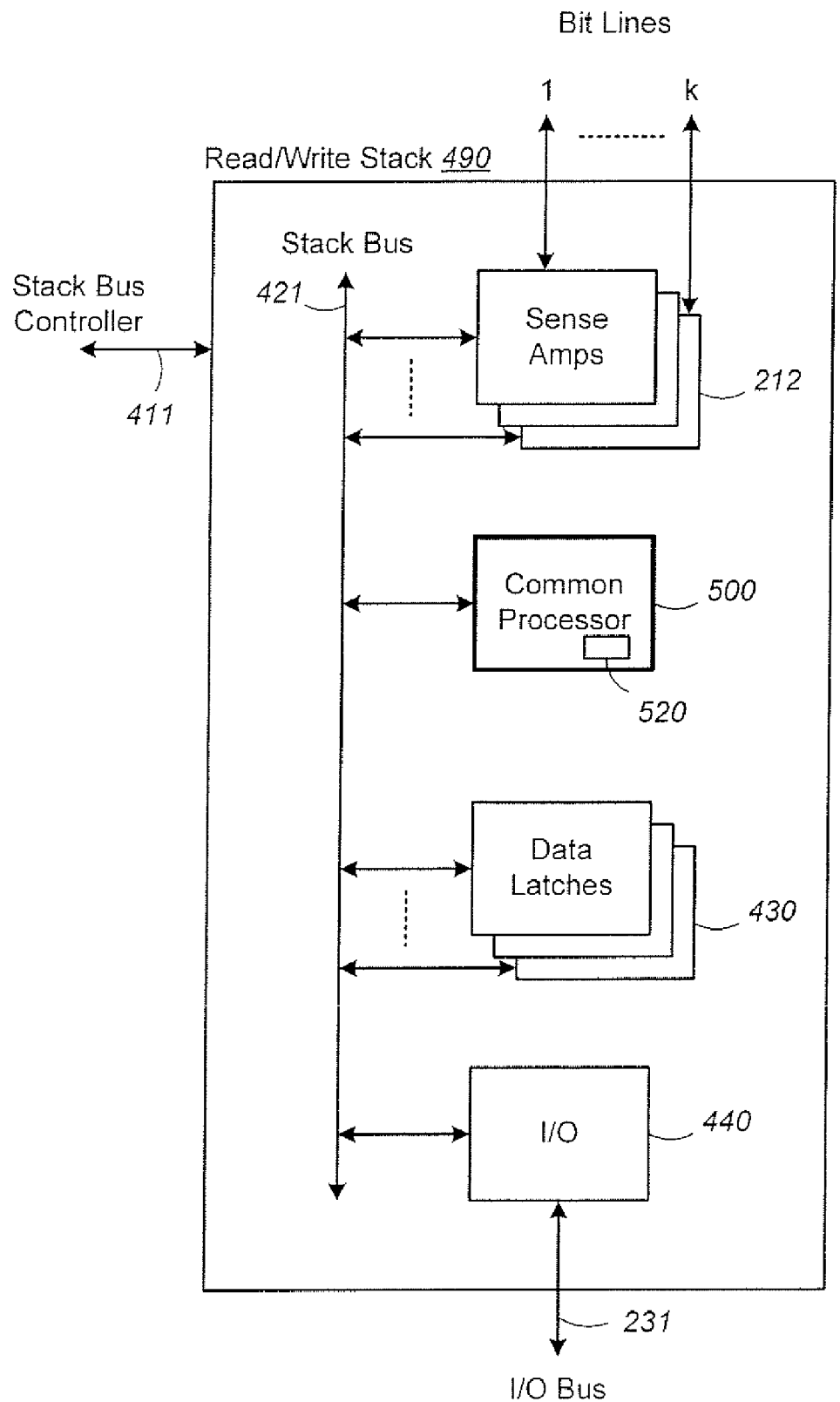
FIG. 6D illustrates schematically a general arrangement of the basic components in a read/write stack shown in FIG. 6C.

FIG. 6D illustrates schematically a general arrangement of the basic components in a read/write stack shown in FIG. 6C. The read/write stack 490 comprises a stack of sense amplifiers 212 for sensing k bit lines, an I/O module 440 for input or output of data via an I/O bus 231, a stack of data latches 430 for storing input or output data, a common processor 500 to process and store data among the read/write stack 400, and a stack bus 421 for communication among the stack components. A stack bus controller among the read/write circuits 370 provides control and timing signals via lines 411 for controlling the various components among the read/write stacks. The common processor includes one or more registers or latches 520 for temporary storing data during processing.

A preferred read/write stack has been disclosed in U.S. patent application Ser. No. 11/026,536 filed Dec. 29, 2004. A preferred sense amplifier is disclosed in United States Patent Publication No. 2004-0109357-A1. Both aforementioned documents are hereby incorporated herein by reference.

Examples of Reading and Programming for Multistate Memory

FIGS. 7A-7E, 8A-8E, 9A-9E respectively illustrate three examples of multi-bit encoding for a 4-state memory. In a 4-state memory cell, the four states can be represented by two bits. One existing technique is to use a 2-pass programming to program such memory. A first bit (lower page bit) is programmed by a first pass. Subsequently, the same cell is programmed in a second pass to represent a desired second bit (upper page bit). In order not to change the value of the first bit in the second pass, the memory state representation of the second bit is made to depend on the value of the first bit.

FIGS. 7A-7E illustrate the programming and reading of the 4-state memory encoded with a conventional 2-bit Gray code. The memory cell's range of programmable threshold voltages (threshold window) is partitioned into four regions, representing an unprogrammed "U" state, and three other increasingly programmed states, "A", "B" and "C". The four regions are demarcated respectively by, demarcation threshold voltages $D_A$, $D_B$ and $D_C$.

Figure 7A:
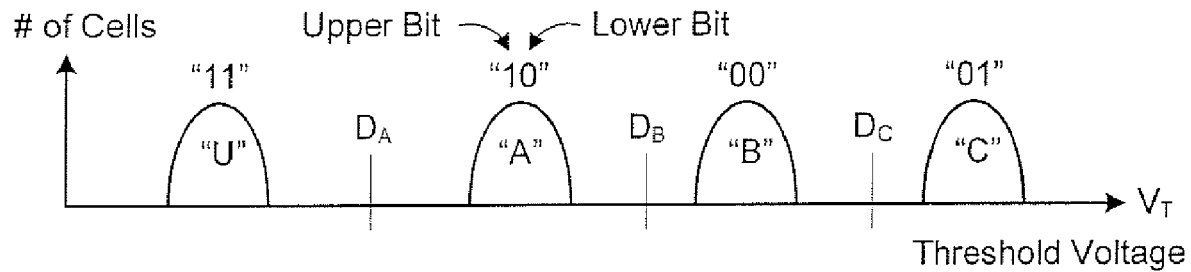
FIG. 7A illustrates threshold voltage distributions of the 4-state memory array when each memory cell stores two bits of data using a conventional Gray code.

FIG. 7A illustrates threshold voltage distributions of the 4-state memory array when each memory cell stores two bits of data using a conventional Gray code. The four distributions represent the population of the four memory states, "U", "A", "B" and "C", Before a memory cell is programmed, it is first erased into its "U" or "unprogrammed" state. The memory states "A", "B" and "C" are progressively reached as the memory cell get increasingly programmed. The Gray code uses the (Upper bit, Lower bit) to designate "U" as (1, 1), "A" as (1, 0), "B" as (0, 0) and "C" as (0, 1).

Figure 7B:
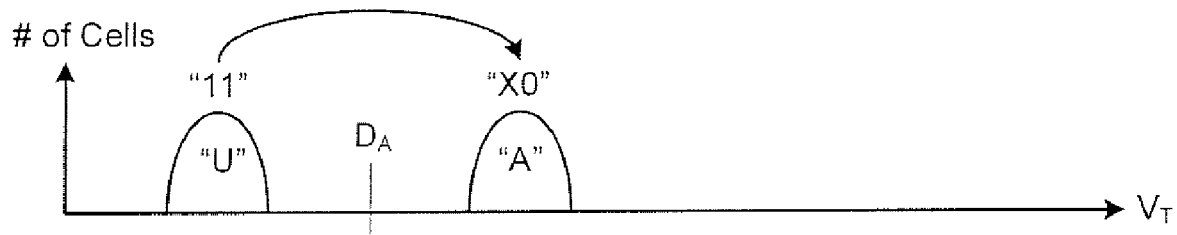
FIG. 7B illustrates the lower page programming in an existing, 2-pass programming scheme using the Gray code.

FIG. 7B illustrates the lower page programming in ma existing, 2-pass programming scheme using the Gray code. For a page of cells to be programmed in parallel, the upper and lower bits will give rise to two logical pages: a logical lower page consisting of the lower bits and a logical upper page consisting of the upper bits. A first programming pass only programs the logical lower page bits. By appropriate coding, a subsequent, second programming pass on the same page of cells will program the logical upper page bits without resetting the logical lower page bits. The Gray code is a commonly used code where only one bit changes when transiting to an adjacent state. Therefore, this code has the advantage of placing less demand on error correction since only one bit is involved.

A general scheme in using the Gray code is to let "1" represent a "not program" condition. Thus, the erased memory state "U" is represented by (Upper page bit, Lower page bit)=(1, 1). In a first pass to program the logical lower page, any cell to store the bit "0" will therefore have its logical state transit from (x, 1) to (x, 0), where "x" represent the "don't care" value of the upper bit. However, since the upper bit has not been programmed yet, "x" may as well be labeled by "1" for consistency. The (1, 0) logical state is represented by programming the cell to the memory state "A". That is, prior to a second program pass, the lower bit value of "0" is represented by the memory state "A".

Figure 7C:
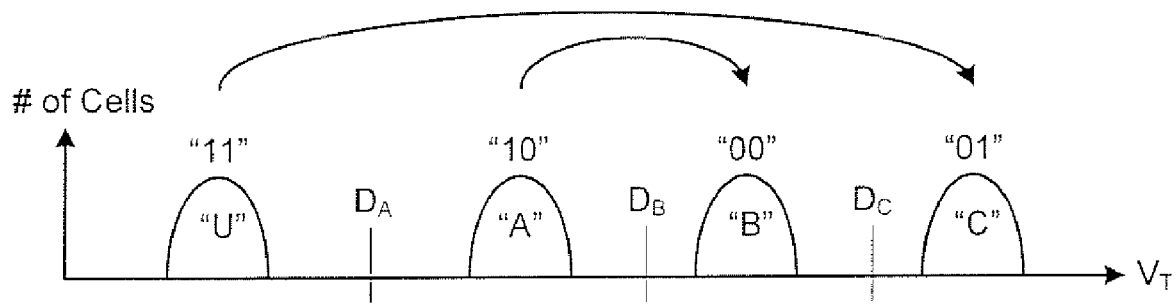
FIG. 7C illustrates the upper page programming in an existing, 2-pass programming scheme using the Gray code.

FIG. 7C illustrates the upper page programming in all existing, 2-pass programming scheme using the Gray code. A second pass programming is performed to store the bits of the logical upper page. Only those cells needing an upper page bit value of "0" will be programmed. After the first pass, the cells in the page are either in the logical state (1, 1) or (1, 0). In order to preserve the values of the lower page in the second pass, the lower bit value of "0" or "1" need to be distinguished. For the transition from (1, 0) to (0, 0) the memory cell in question is programmed to the memory state "B". For the transition from (1, 1) to (0, 1) the memory cell in question is programmed to the memory state "C". In this way, during read, by determining the memory state programmed in a cell, both the lower page bit and the upper page bit can be decoded.

Programming is accomplished by alternately applying a programming pulse to a page of memory cells in parallel followed by sensing or program verifying on each of the cells to determine if any of them has been programmed to their target states. Whenever a cell has been program verified, it is locked out or program inhibited from further programming even as the programming pulses continue to be applied to complete the programming of the other cells in the group. It can be seen from FIGS. 7B and 7C that during the lower page programming, program verification need be performed relative to state "A" (denoted by "verifyA") with the demarcation threshold voltage $D_A$. However, for the upper page programming, program verification need be performed relative to states "B" and "C". Thus, the upper page verify will require a 2-pass verify of "verifyB" and "verifyC", respectively relative to the demarcation threshold voltages $D_B$ and Dc.

Figure 7D:
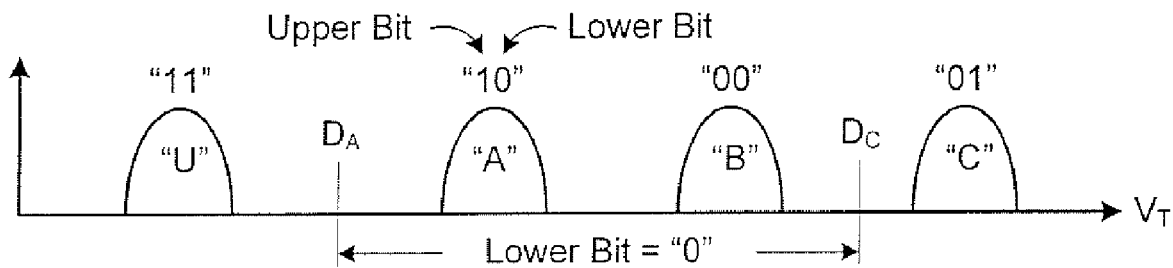
FIG. 7D illustrates the read operation that is required to discern the lower bit of the 4-state memory encoded with the Gray code.

FIG. 7D illustrates the read operation that is required to discern the lower bit of the 4-state memory encoded with the Gray code. Since the memory states "A" encoded by (1, 0) and "B" encoded by (0, 0) both have "0" as their lower bits, the lower hit "0" will be detected when ever a memory cell is programmed to either states "A" or "B". Conversely, the lower bit "1" will be detected whenever a memory cell is unprogrammed at state "U" or programmed to state "C". Thus, the lower page read will require a 2-pass read of readA and readC, respectively relative to the demarcation threshold voltages $D_A$ and $D_C$.

Figure 7E:
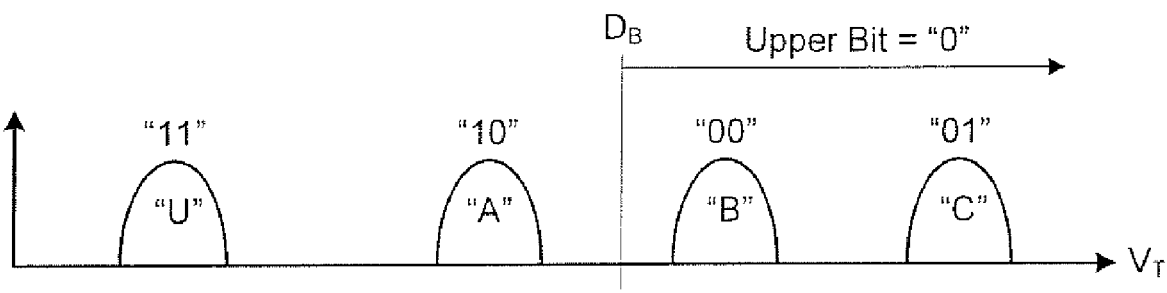
FIG. 7E illustrates the read operation that is required to discern the upper bit of the 4-state memory encoded with the Gray code.

FIG. 7E illustrates the read operation that is required to discern the upper bit of the 4-state memory encoded with the Gray code. It will require one read pass of readB relative to the demarcation threshold voltage $D_B$. In this way, any cells with programmed threshold voltages less than $D_B$ will be detected to be at memory state "1" and vice versa.

The Gray-code, 2-pass programming scheme can become a problem when the second-pass programming is erroneous. For example, the programming of the upper page bit to "0" while the lower bit is at "1" will cause the transition from (1, 1) to (0, 1). This requires the memory cell to be progressively programmed from "U" through "A" and "B" to "C". If there is a power outage before the completion of the programming, the memory cell may end up in one of the transition memory state, say "A". When the memory cell is read, "A" will be decoded as the logical state (1, 0). This gives incorrect results for both the upper and lower bits, since it should have been (0, 1). Similarly, if the programming is interrupted when "B" is reached, it would correspond to (0, 0). While the upper bit is now correct, the lower bit is still wrong. Furthermore, because of the possible transition from the unprogrammed state "U" all the way to the most programmed state "C", this code scheme has the effect of exacerbating the potential differences between charge levels of adjacent cells programmed at different times. Thus, it also exacerbates the field-effect coupling ("Yupin Effect") between adjacent floating gates.

Figure 8A:
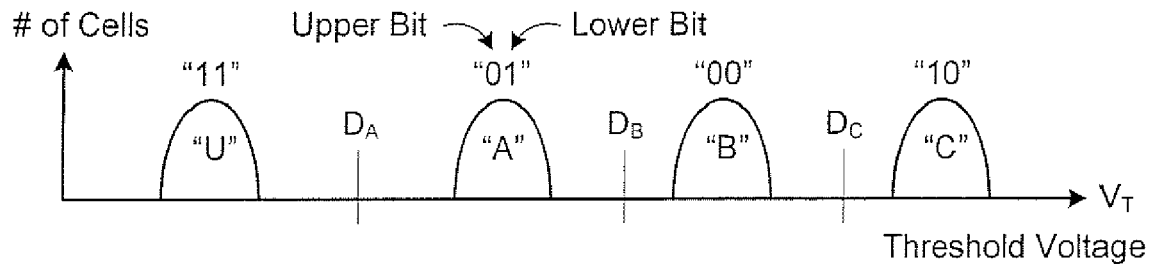
FIG. 8A illustrates threshold voltage distributions of the 4-state memory array when each memory cell stores two bits of data using the LM code.

FIGS. 8A-8E illustrate the programming and reading of the 4-state memory encoded with another logical code ("LM" code). This code provides more fault-tolerance and alleviates the neighboring cell coupling due to the Yupin Effect. FIG. 8A illustrates threshold voltage distributions of the 4-state memory array when each memory cell stores two bits of data using the LM code. The LM coding differs from the conventional Gray code shown in FIG. 7A in that the upper and lower bits are reversed for states "A" and "C". The "LM" code has been disclosed in U.S. Pat. No. 6,657,891 and is advantageous in reducing the Held-effect coupling between adjacent floating gates by avoiding program operations that require a large change in charges.

Figure 1A:
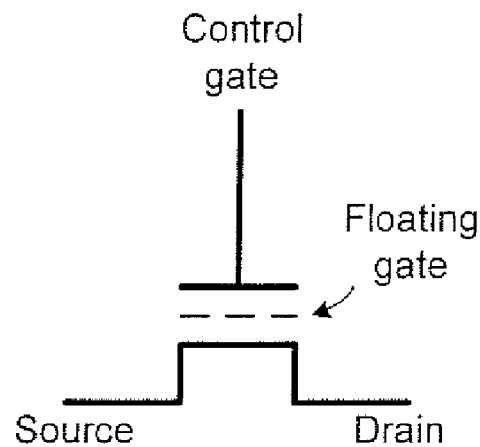
FIGS. 1A-1E illustrate schematically different examples of non-volatile memory cells.
Figure 1B:
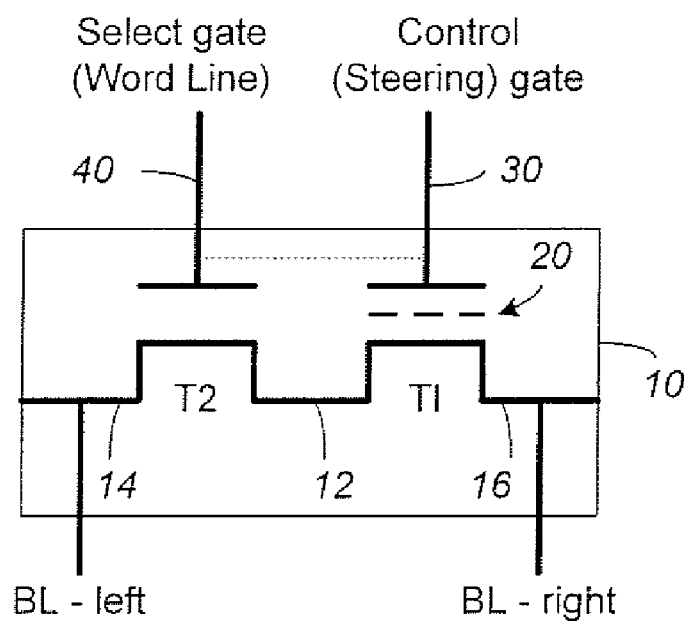
Figure 1C:
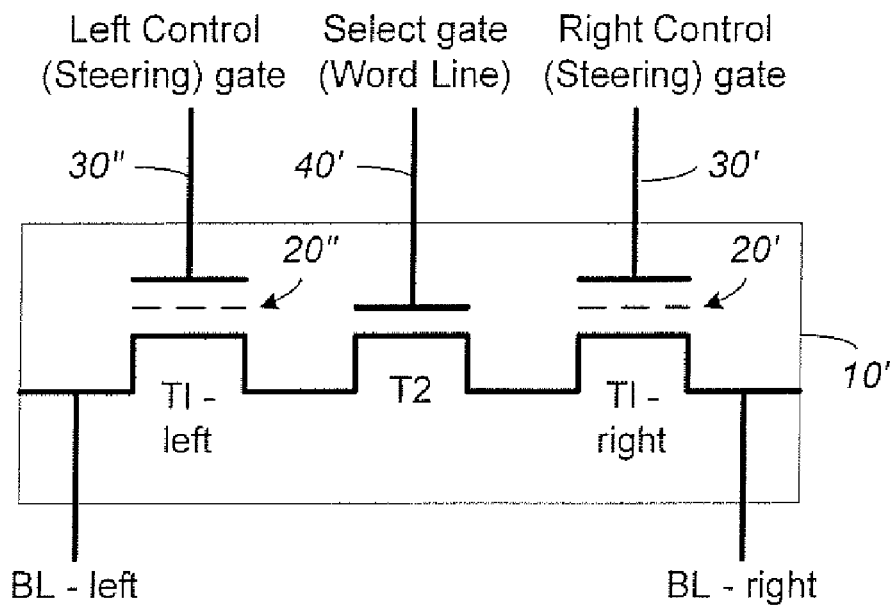
Figure 1E:
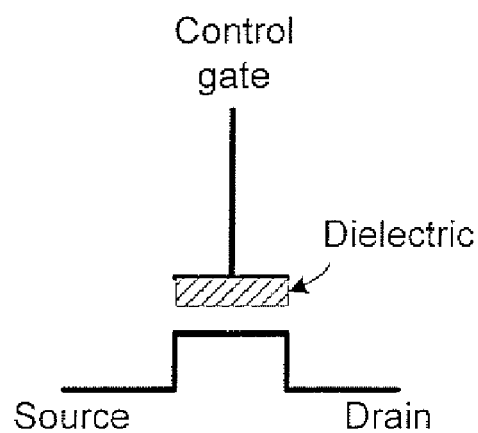
Figure 1D:
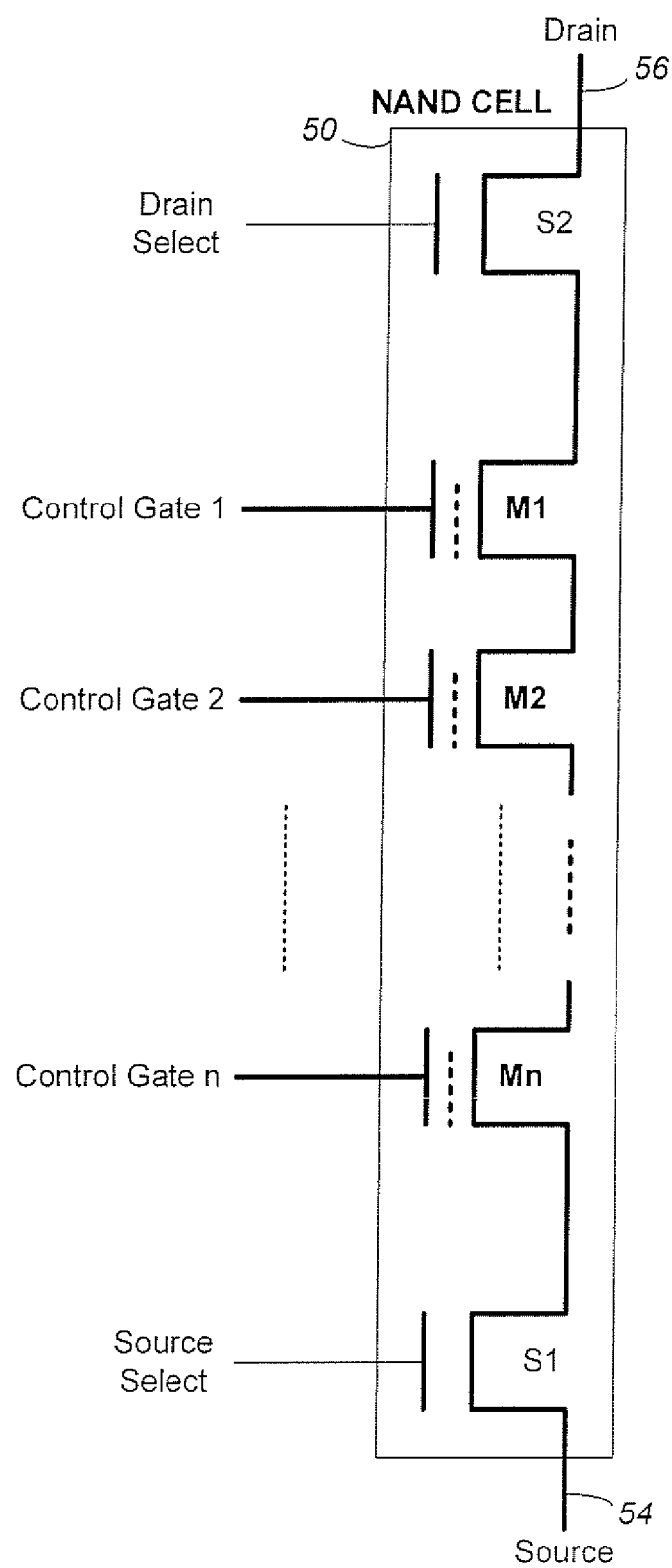
Figure 2:
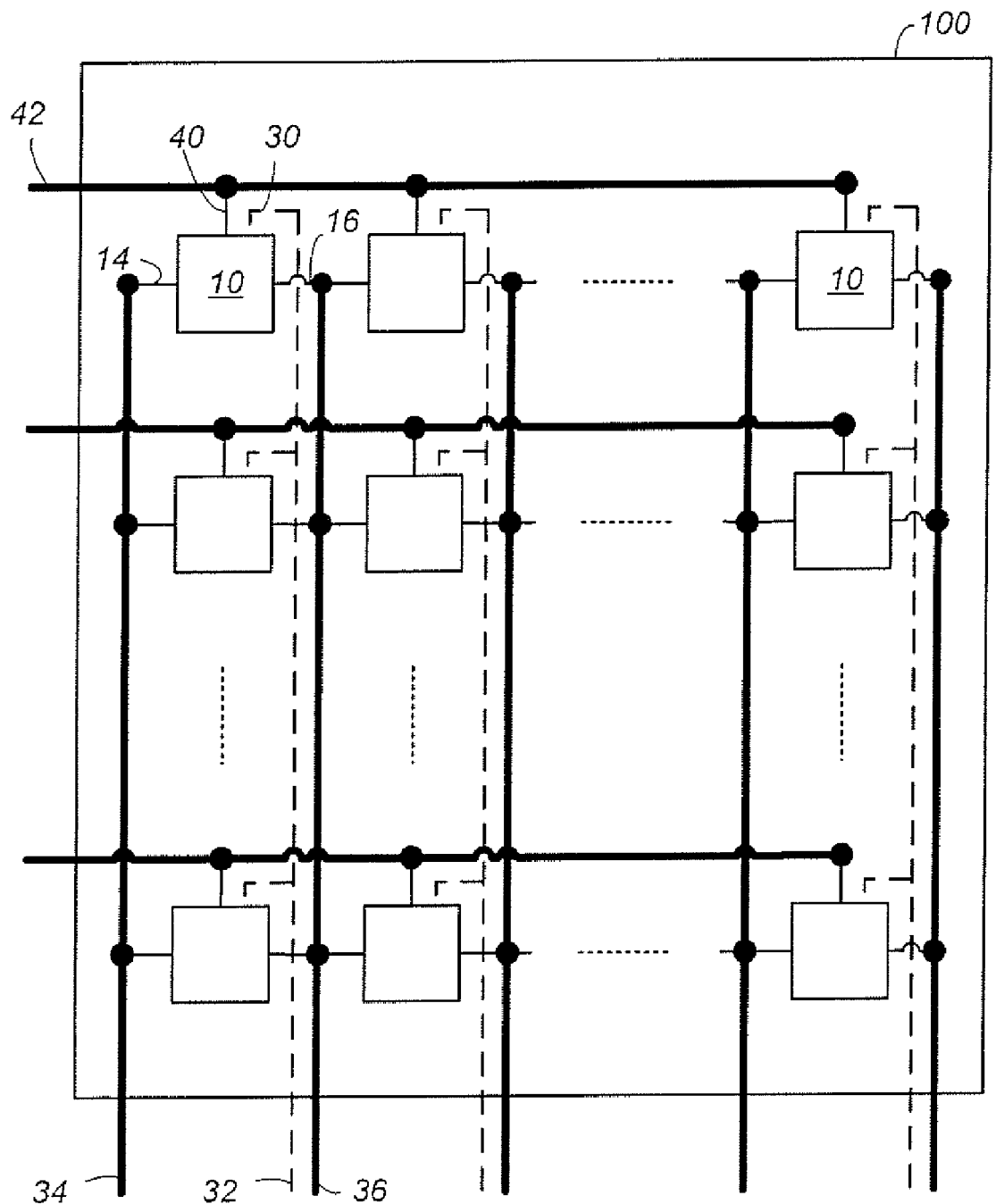
FIG. 2 illustrates an example of an NOR array of memory cells.
Figure 3:
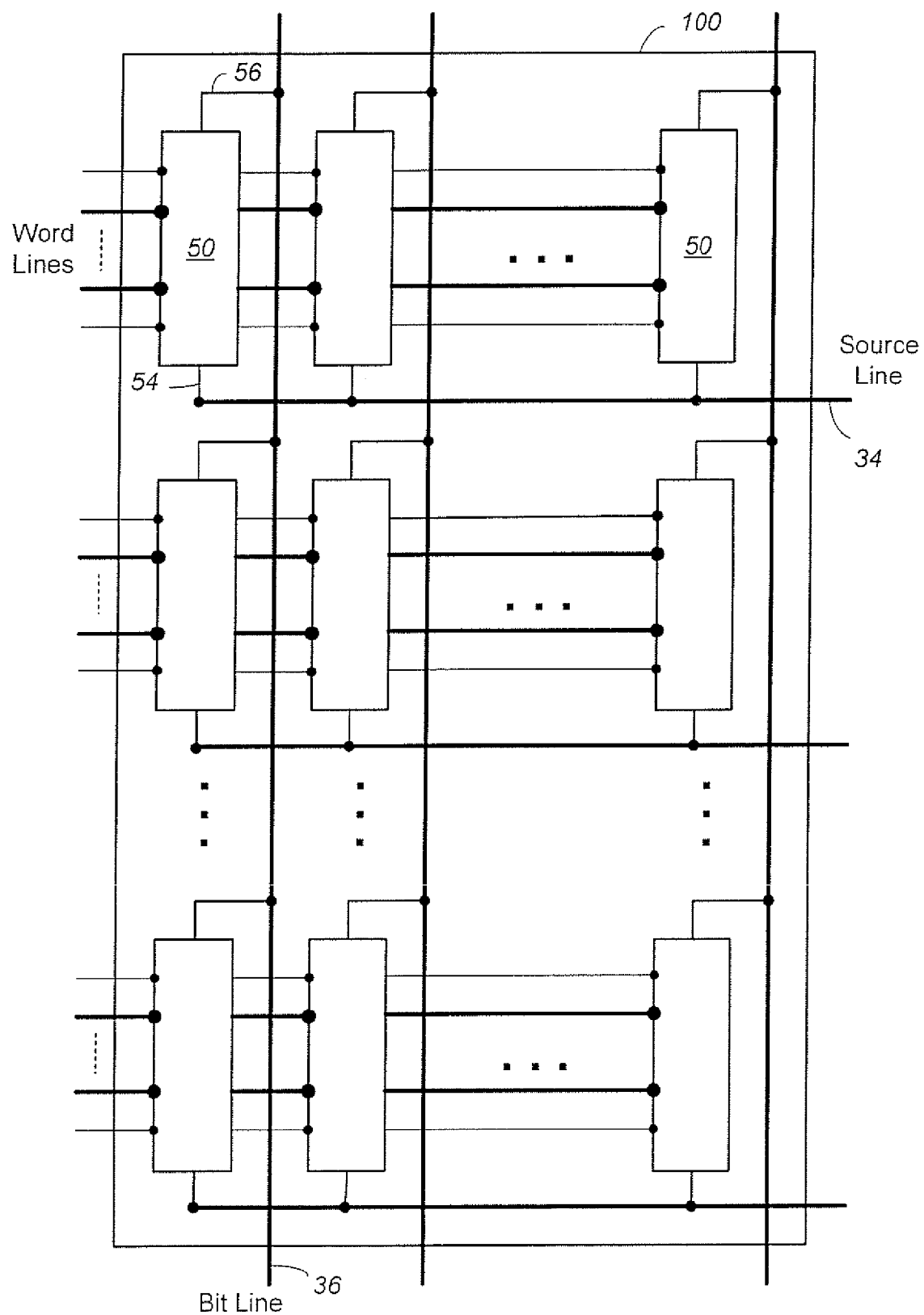
FIG. 3 illustrates an example of an NAND array of memory cells, such as that shown in FIG. 1D.
Figure 4:
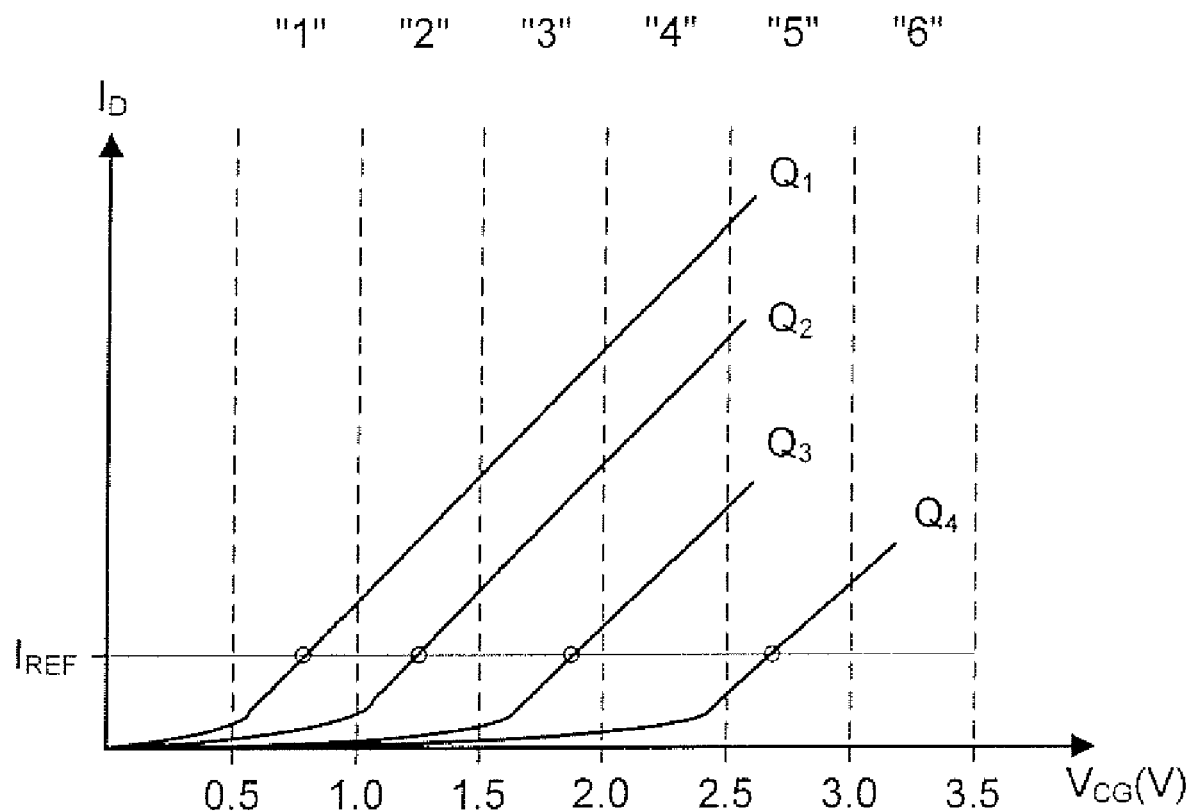
FIG. 4 illustrates the relation between the source-drain current and the control gate voltage for four different charges Q1-Q4 that the floating gate may be storing at any one time.
Figure 5:
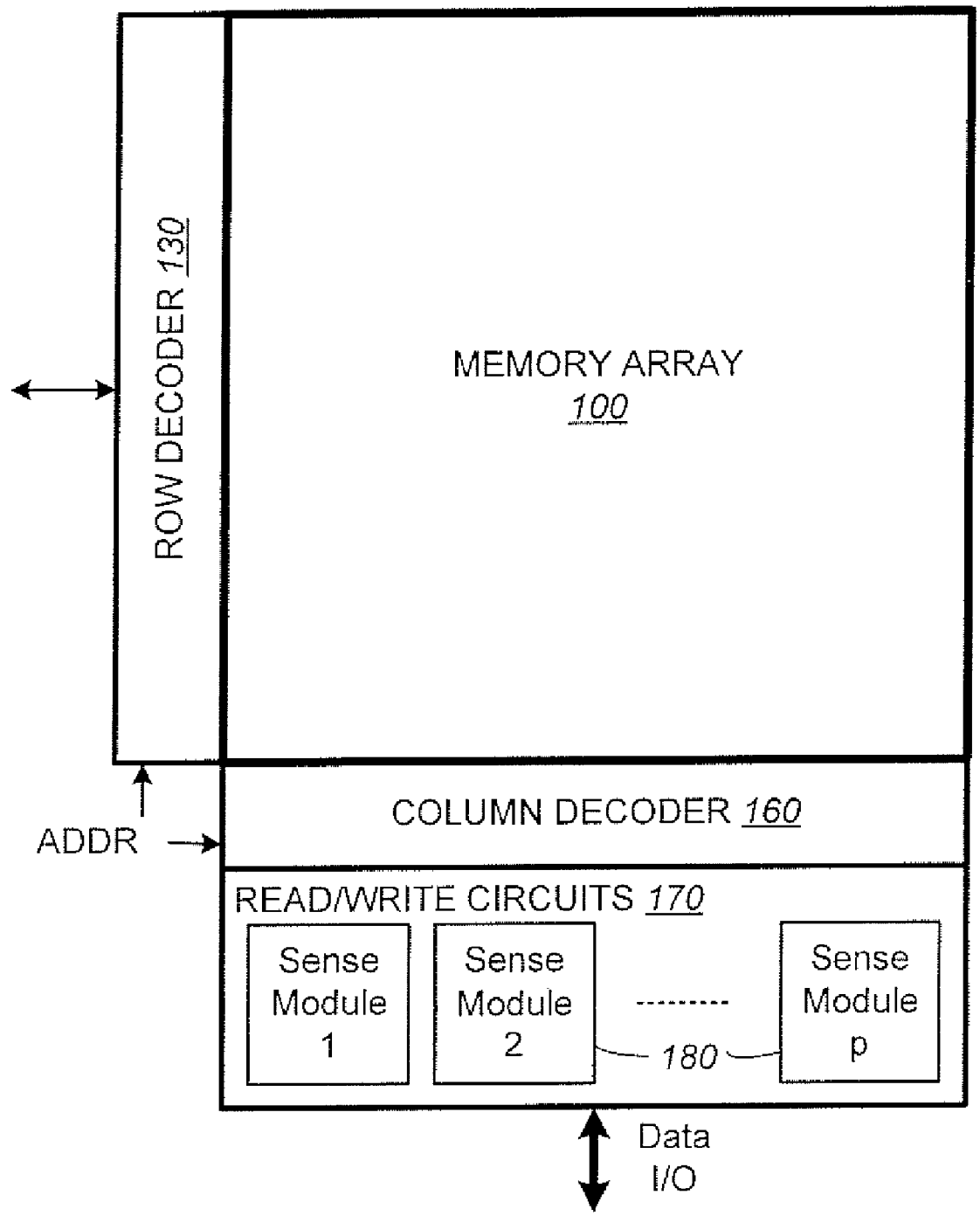
FIG. 5 illustrates schematically a typical arrangement of a memory array accessible by read/write circuits via row and column decoders.
Figure 8B:
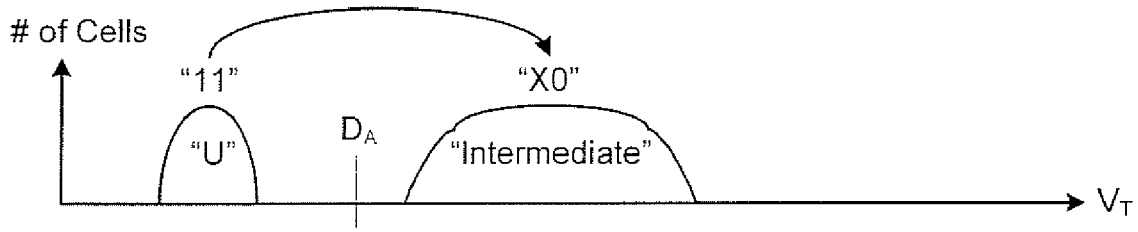
FIG. 8B illustrates the lower page programming in an existing, 2-pass programming scheme using the LM code.
Figure 8C:
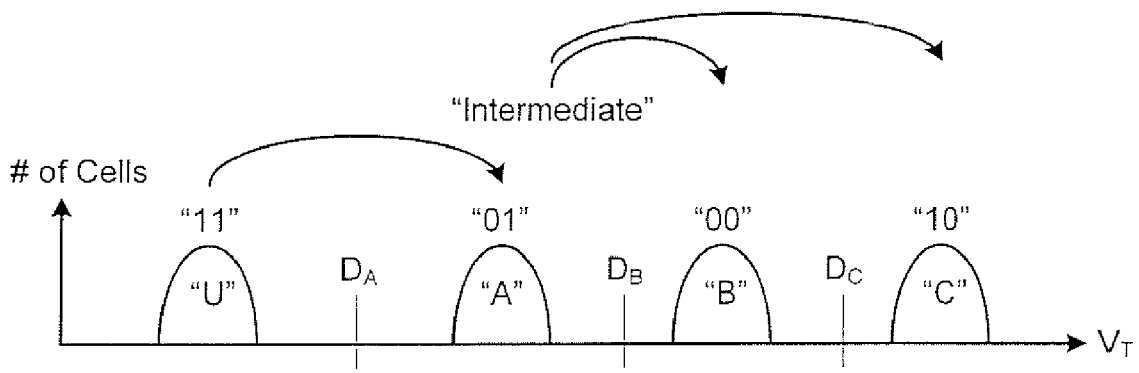
FIG. 8C illustrates the upper page programming in an existing, 2-pass programming scheme using the LM code.

FIG. 8B illustrates the lower page programming in an existing, 2-round programming scheme using the LM code. The fault-tolerant LM code essentially avoids any upper page programming to transit through any intermediate states. Thus, the first round lower pare programming has the logical state (1, 1) transits to some intermediate state (x, 0) as represented by programming the "unprogrammed" memory state "U" to an "intermediate" state designated by (x, 0) with a programmed threshold voltage among a broad distribution that is greater than $D_A$ but less than $D_C$. FIG. 5C illustrates the upper page programming in an existing, 2-round programming scheme using the LM code. In the second round of programming the upper page bit to "0", if the lower page bit is at "1", the logical state (1, 1) transits to (0, 1) as represented by programming the "unprogrammed" memory state "U" to "A". If the lower page bit is at "0", the logical state (0, 0) is obtained by programming from the "intermediate" state to "B". Similarly, if the upper page is to remain at "1", while the lower page has been programmed to "0", it will require a transition from the "intermediate" state to (1, 0) as represented by programming the "intermediate" state to "C". Since the upper page programming only involves programming to the next adjacent memory state, no large amount of charges is altered from one round to another. The lower page programming from "U" to a rough "intermediate" state is designed to save time. However, this will result in the "LM" code equally vulnerable to the upper page program error or power outage during upper page programming. For example, the state "A" may move to the threshold voltage which can not be distinguished from the "intermediate" state.

Figure 8D:
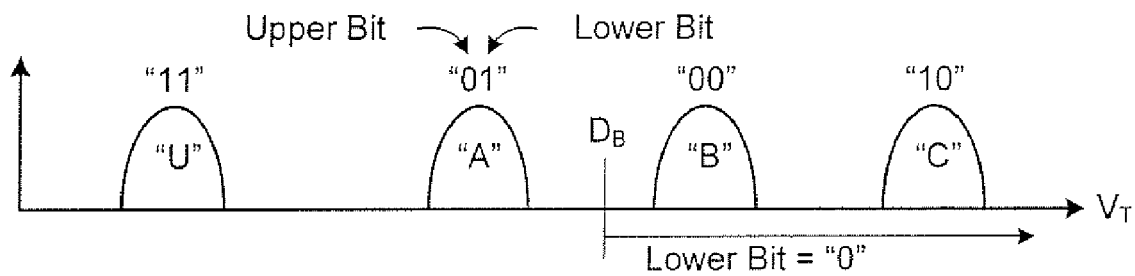
FIG. 8D illustrates the read operation that is required to discern the lower bit of the 4-state memory encoded with the LM code.

FIG. 8D illustrates the read operation that is required to discern the lower bit of the 4-state memory encoded with the LM code. The decoding will depend on whether the upper page has been programmed or not. If the upper page has been programmed, reading the lower page will require one read pass of readB relative to the demarcation threshold voltage $D_B$. Oil the other hand, if the upper pace has not yet been programmed, the lower page is programmed to the "intermediate" state (FIG. 5B), and readB will cause error. Rather, reading the lower page will require one read pass of readA relative to the demarcation threshold voltage $D_A$. In order to distinguish the two cases, a flag ("LM" flag) is written in the upper page when the upper page is being programmed. During a read, it will first assume that the upper page has been programmed and therefore a readB operation will be performed. If the LM flag is read, then the assumption is correct and the read operation is done. On the other hand, if the first read did not yield a flag, it will indicate that the upper page has not been programmed and therefore the lower page would have to be read by a readA operation.

Figure 8E:
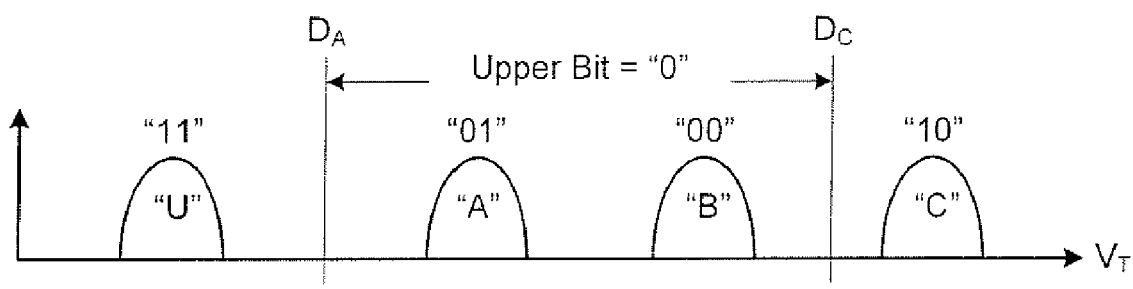
FIG. 8E illustrates the read operation that is required to discern the upper bit of the 4-state memory encoded with the LM code.

FIG. 8E illustrates the read operation that is required to discern the upper bit of the 4-state memory encoded with the LM code. As is clear from the figure, the upper page read will require a 2-pass read of readA and readC, respectively relative to the demarcation threshold voltages $D_A$ and $D_C$. Similarly, the decoding of upper page can also be confused by the "intermediate" state if the upper page is not yet programmed. Once again the LM flag will indicate whether the upper page has been programmed or not. If the upper page is not programmed, the read data will be reset to "1" indicating the upper page data is not programmed.

The LM code can also become a problem in a memory that supports partial page programming. While a page of memory cells are programmed or read in parallel, partial page programming allows a portion of the page to be programmed in one pass and the unprogrammed remaining portion to be programmed in a subsequent pass. The LM code presents a problem in a programming operation where an upper page is only partially filled with data. In a subsequent upper page programming to complete the partially unfilled page, the data may be programmed to the wrong states. By convention a "1" bit represents a "no program" condition and therefore both the lower and upper bits default to "1" initially in the unprogrammed "U" state. The tipper page bit should be "1" representing cells in the unfilled portion. If the lower page bit for a cell in the unfilled portion happens to be "1", the resulting logical state (1, 1) will have the cell remain at "U". However, if the lower page bit is "0" it would result in the logical state (1, 0) which will cause the cell to be programmed to the most programmed (highest threshold voltage) "C" state. A subsequent programming pass to complete the unfilled portion can no longer entertain the possibility of getting to the (0, 0) or "B" state since it is not possible to roll back to a less programmed state from "C".

Figure 9A:
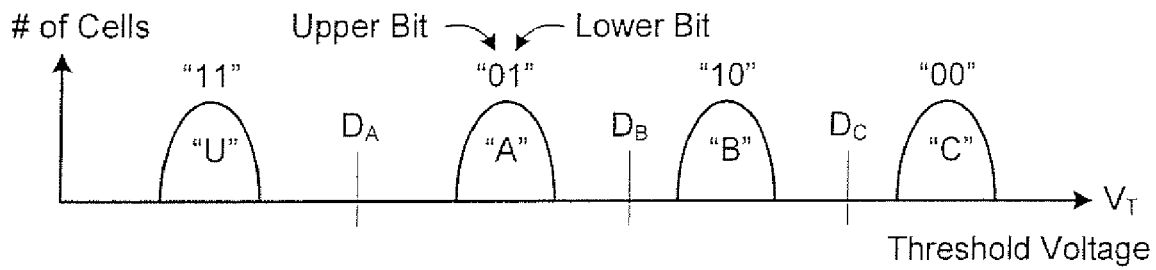
FIG. 9A illustrates threshold voltage distributions of the 4-state memory array when each memory cell stores two bits of data using the LM New code.

FIGS. 9A-9E illustrate the programming and reading of the 4-state memory encoded with a preferred, logical code ("LM New" code). The LM New code is similar to the LM code but without the disadvantages described above. FIG. 9A illustrates threshold voltage distributions of the 4-state memory array when each memory cell stores two bits of data using the LM New code. The LM New code has been disclosed in US Patent Publication No. 2005-0237814 A1, dated Oct. 27, 2005 by Li et al., entitled "NON-VOLATILE MEMORY AND CONTROL WITH IMPROVED PARTIAL PAGE PROGRAM CAPABILITY". The code differs from the LM code shown in FIG. 8A in that the logical coding for states "B" and "C" are interchanged. Thus the (Upper bit, Lower bit) for "U" is (1, 1), for "A" is (0, 1), for "B" is (1, 0) and for "C" is (0, 0). This coding avoids the problem of partial page programming in the LM code described above since the partially unfilled tipper page is now programmed to the "B" state when the lower bit is at "0". Subsequent programming of the partially unfilled portion will allow programming from the (1, 0) to the (0, 0) logical state, which corresponds to programming from the "B" to the "C" state.

Figure 9B:
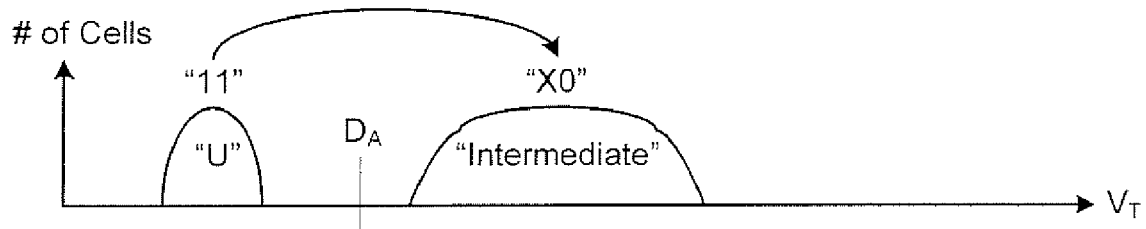
FIG. 9B illustrates the lower page programming in an existing, 2-pass programming scheme using the LM New code.

FIG. 9B illustrates the lower page programming in an existing, 2-pass programming scheme using the LM New code. The fault-tolerant LM New code essentially avoids any upper page programming to transit through any intermediate states. Thus, the first pass lower page programming has the logical state (1, 1) transits to some intermediate state (x, 0) as represented by programming the "unprogrammed" memory state "U" to the "intermediate" state designated by (x, 0) with a programmed threshold voltage greater than $D_A$ but less than $D_C$.

Figure 9C:
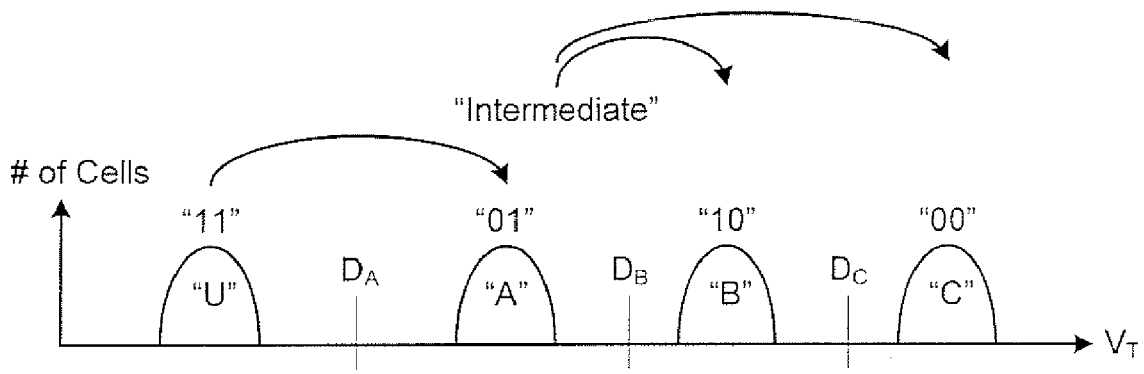
FIG. 9C illustrates the upper page programming in an existing 2-pass programming scheme using the LM New code.

FIG. 9C illustrates the upper page programming in an existing, 2-pass programming scheme using the LM New code. In the second pass of programming the upper page bit to "0", if the lower page bit is at "1", the logical state (1, 1) transits to (0, 1) as represented by programming the "unprogrammed" memory state "U" to "A". If the lower page bit is at "0", the logical state (0, 0) is obtained by programming from the "intermediate" state to "C". Similarly, if the upper page is to remain at "1", while the lower page has been programmed to "0", it will require a transition from the "intermediate" state to (1, 0) as represented by programming the "intermediate" state to "B".

Figure 9D:
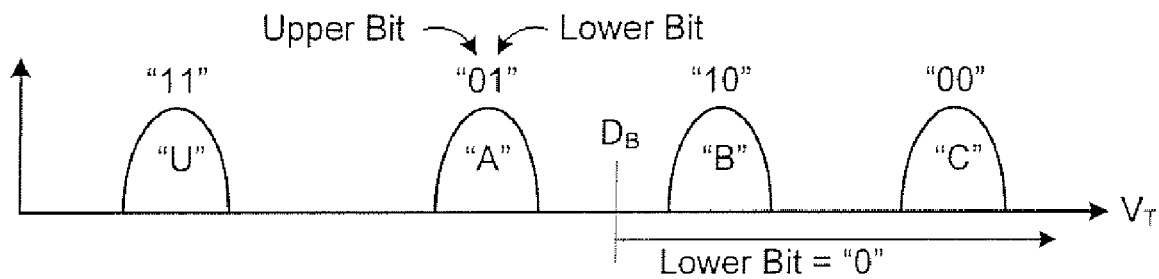
FIG. 9D illustrates the read operation that is required to discern the lower bit of the 4-state memory encoded with the LM New code.

FIG. 9D illustrates the read operation that is required to discern the lower bit of the 4-state memory encoded with the LM New code. The same consideration applies here as in the case for the LM code. A readB operation is first performed to determine if the LM flag can be read. If so, the upper page has been programmed and the readB operation will yield the lower page data correctly. On the other hand, if the upper page has not yet been programmed, the lower page data will be read by a readA operation.

Figure 9E:
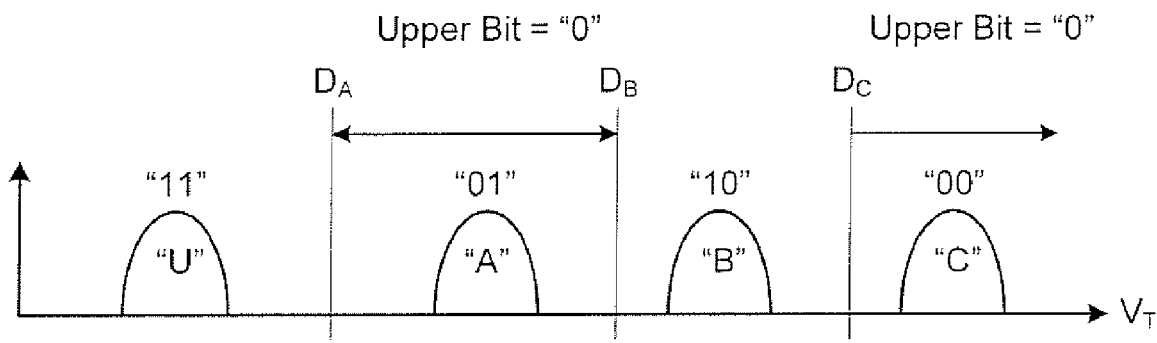
FIG. 9E illustrates the read operation that is required to discern the upper bit of the 4-state memory encoded with the LM New code.

FIG. 9E illustrates the read operation that is required to discern the upper bit of the 4-state memory encoded with the LM New code. As is clear from the figure, the tipper page read will require a 3-pass read of readA, readB and readC, respectively relative to the demarcation threshold voltages $D_A$, $D_B$ and $D_C$. The decoding of the upper page has the same consideration described with regard to the LM flag for the LM code above.

The discussion of the various codes above for an example 4-state memory shows that a read operation can involve a single sensing pass as in "readB" which is comparing the programmed threshold voltage relative to the demarcation threshold voltage $D_B$. The readB operation is applicable for reading the upper page under the conventional Gray code or the lower page under the LM code or the lower page under the LM new code.

A read operation can also involve a 2-pass read as in readA and readC in reading the lower page under the conventional Gray code or the tipper page under the LM code.

A read operation can also involve a 3-pass read as in readA, readB and readC in reading the tipper page under the LM New code.

Figure 10:
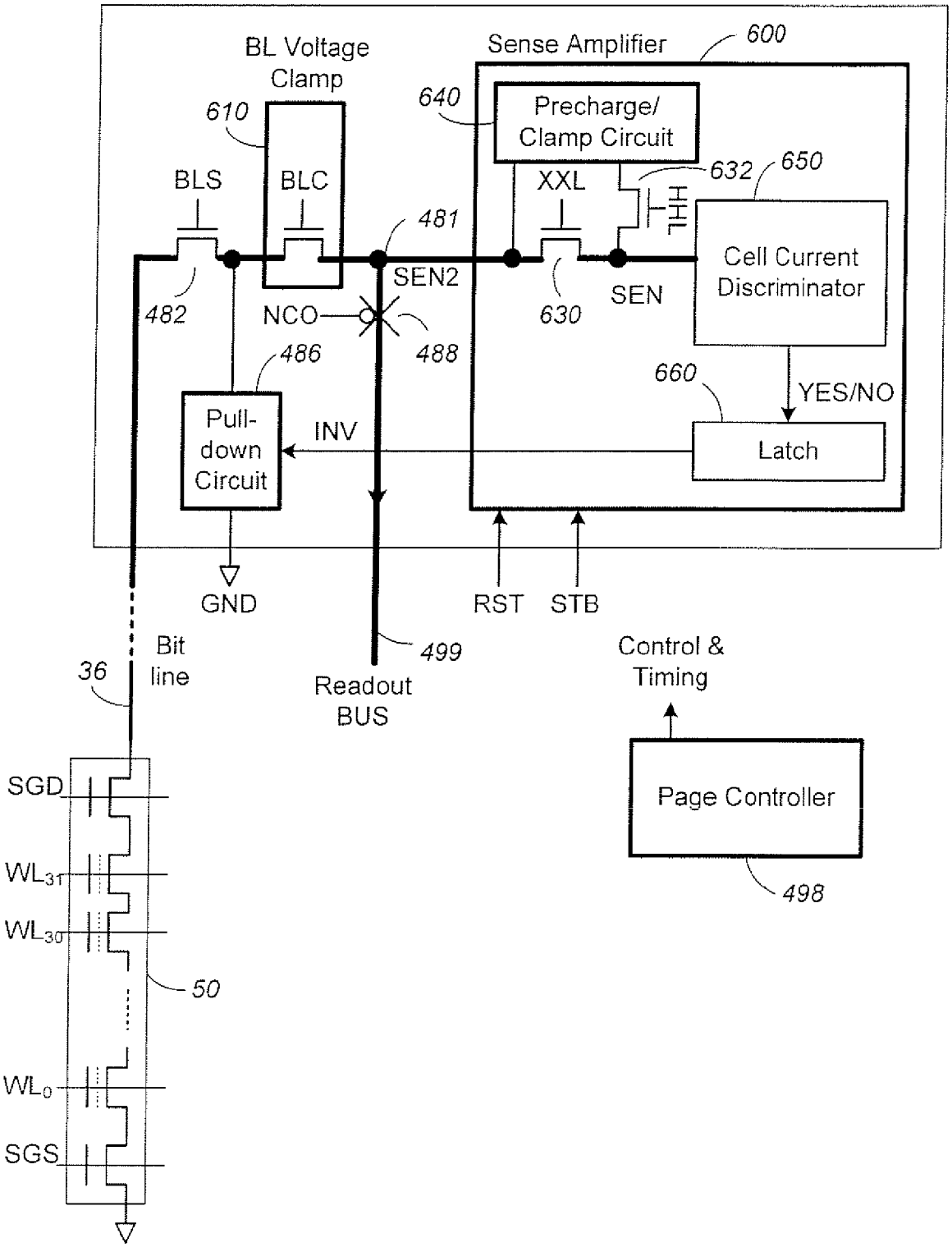
FIG. 10 illustrates schematically in more detail a sense module shown in FIG. 6A that is suitable for sensing the memory described.

FIG. 10 illustrates schematically in more detail a sense module shown in FIG. 6A that is suitable for sensing the memory described. The sense module 480 senses the conduction current of a memory cell in a NAND chain 50 via a coupled bit line 36. It has a sense node 481 that can be selectively coupled to a bit line, a sense amplifier 600 or a readout bus 499. Initially, an isolation transistor 482, when enabled by a signal BLS connects the bit line 36 to the sense node 481. The sense amplifier 600 senses the sense node 481. The sense amplifier includes a precharge/clamp circuit 640, a cell current discriminator 650 and a latch 660.

The sense module 480 enables the conduction current of the selected memory cell in the NAND chain to be sensed. Prior to sensing, the voltages to the gates of the selected memory cell must be set via the appropriate word lines and bit line. As will be described in more detail later, the precharge operation starts with the unselected word line charging to a voltage Vread followed by charging the selected world line to a predetermined threshold voltage $V_T(i)$ for a given memory state under consideration. Then the precharge circuit 640 brings the bit line voltage to a predetermined drain voltage appropriate for sensing. This will induce a source-drain conduction current to flow in the selected memory cell in the NAND chain 50, which is detected from the channel of the NAND chain via a coupled bit line 36. The conduction current is a function of the charge programmed into the memory cell and the applied $V_T(i)$ when there exists a nominal voltage difference between the source and drain of the memory cell.

When the $V_T(i)$ voltage is stable, the conduction current or the programmed threshold voltage of the selected memory cell can be sensed via the coupled bit line 36 via the transistor 630 gated by a signal XXL. The cell current discriminator 650 serves as a discriminator or comparator of current levels. It is coupled to the sense node to sense the conduction current in the memory cell. The sensing starts when the precharge is cut off by a transistor 632 as controlled by a signal HHL. The conduction current will then discharge a reference capacitance in the cell current discriminator 650. A predetermined discharge period ends when the cell is decoupled with the signal XXL turning off the transistor 630. The magnitude of the conduction current sensed is reflected by the amount of voltage discharge of the reference capacitor at the end of this period and this result is latched into the latch 660 when controlled by a strobe signal STB. The cell current discriminator 650 effectively determines whether the cell's conduction current is higher or lower than a given demarcation current value $I_0(j)$. If it is higher, the latch 660 is set to a predetermined state with the signal INV=1 (HIGH).

A pull-down circuit 486 is activated in response to the latch 660 setting the signal INV to HIGH. This will pull down the sense node 481 and therefore the connected bit line 36 to ground voltage. This will inhibit the conduction current flow in the memory cell 10 irrespective of the control gate voltage since there will be no voltage difference between its source and drain.

In general, there will be a page of memory cells being operated on by a corresponding number of multi-pass sense modules 480. A page controller 498 supplies control and timing signals to each of the sense modules. The page controller 498 cycles each of the multi-pass sense module 480 through a predetermined number of passes (j=1 to N) and also supplies a predetermined demarcation current value $I_0(j)$ for each pass. As is well known in the arts, the demarcation current value can also be implemented as a demarcation threshold voltages or time period for sensing. After the last pass, the page controller 498 enables a transfer gate 488 with a signal NCO to read the state of the sense node 481 as sensed data to a readout bus 499. In all, a page of sense data will be read out from all the multipass modules 480. Similar sense modules have been disclosed in US Patent Publication No. 2005-0169082-A1, dated Aug. 4, 2005 by Cernea et al., entitled "IMPROVED MEMORY SENSING CIRCUIT AND METHOD FOR LOW VOLTAGE OPERATION". The entire disclosure of US Patent Publication No. 2005-0169082-A1 is incorporated herein by reference.

Smart Time-Saving Program Verify

An important aspect in the performance of non-volatile memories is programming speed. This section discusses methods of improving programming performance of multi-state non-volatile memories. Specifically, an improved programming operation is implemented with a time-saving program verify.

Quick Pass Write ("QPW")

A preferred program operation is referred to as "Quick Pass Write" (or "QPW"), which has been disclosed in U.S. Pat. No. 6,643,188, and which is hereby incorporated by reference in its entirety.

The goal in programming a memory is to write the data quickly, but with precision. In a binary memory, it is only necessary to use one demarcation threshold level to distinguish between two memory states. When a memory cell is programmed with a threshold above the demarcation threshold level it is considered to be in a "programmed" state, otherwise it remains in an "unprogrammed" state. Alternatively for a given gate voltage, a less programmed cell will have more conduction current. Thus, when a demarcation threshold voltage is applied to the gate of a memory cell, there will be corresponding demarcation conduction current. If a cell has conduction current higher than the demarcation conduction current, it is considered to be in the unprogrammed state; otherwise it is in the programmed state.

In a multi-state memory, the situation is more complicated since, for each intermediate state, is demarcated between two demarcation threshold levels. When programming to an intermediate state, the cell must be programmed with a threshold in between the two demarcation levels. So it must lie above a first demarcation level, but not too high above or its will overshoot the second demarcation level. Thus, there is a need for accurate programming. In terms of programming a population of memory cells, it amounts to having the population of the cells clusters tightly between the demarcation levels (see FIGS. 7-8.) Any inaccuracies in programming would lead to the distribution of a given state erroneously spreading beyond its demarcation levels. Even if the distribution is within bounds but spread out to the limits, it will be prone to error due to program disturb or other environmental effects. This problem is aggravated as the number of states increases, or when the available threshold window is reduced, or both.

One technique to tighten the state distribution is by programming the same data multiple times. An example is the coarse-fine programming method described in U.S. Pat. No. 6,738,289, which is hereby incorporated by reference.

Figure 11:
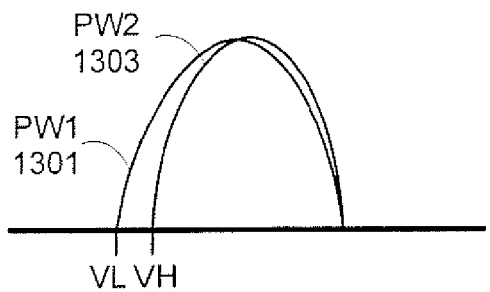
FIG. 11 shows two distributions of memory cells with a given programmed memory state, where the more spread out distribution is produced by a single-pass programming verified at the VL level and the tighter distribution is produced by a two-pass programming with the second pass verified at the VH level.

FIG. 11 shows two distributions of memory cells with a given programmed memory state, where the more spread out distribution is produced by a single-pass programming verified at the VL level and the tighter distribution is produced by a two-pass programming with the second pass verified at the VH level. In a first pass, the cells have been written with a programming waveform PW1 using a first, lower verify level VL, producing distribution 1301. The programming waveform then starts over at lower value for the second pass. In the second pass, a programming waveform PW2 uses a second, higher verify level VH, to shift this to distribution 1303. This allows the first pass to place the cells into a rough distribution that is then tightened tip in the second pass.

Figure 12:
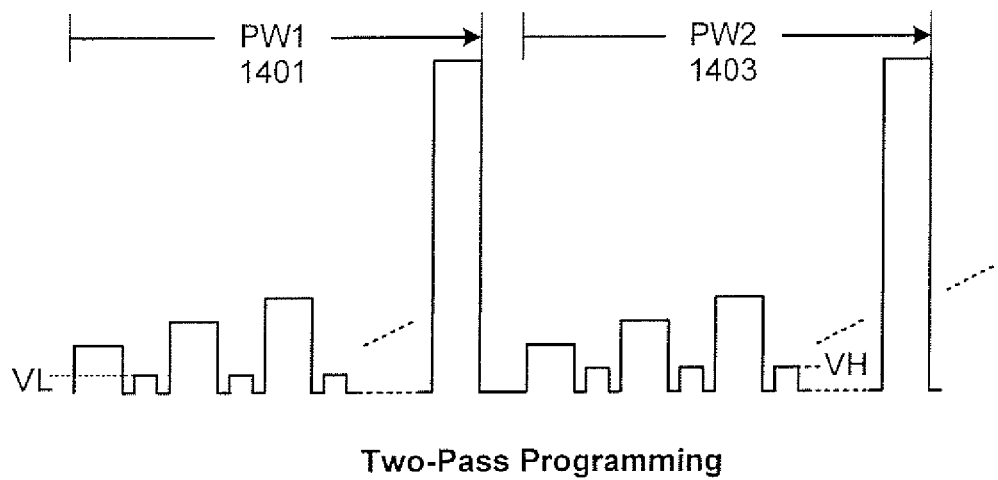
FIG. 12 shows an example of a two-pass programming waveform.

FIG. 12 shows an example of a two-pass programming waveform. In between each programming pulse is a smaller gate voltage level for sensing of the state of the memory cell after the last programming pulse. The first staircase PW1 1401 uses the lower verify level VL, while PW2 uses the upper verify level VH. The second pass (PW2 1403) may use a small step size, as described in U.S. Pat. No. 6,738,289, but, aside from the different verify levels, the processes are the same. The shortcoming of this approach is that each programming sequence requires two passes: the programming waveform has to go through both of the full staircases, executing 1401 and then starting over with 1403.

Figure 13:
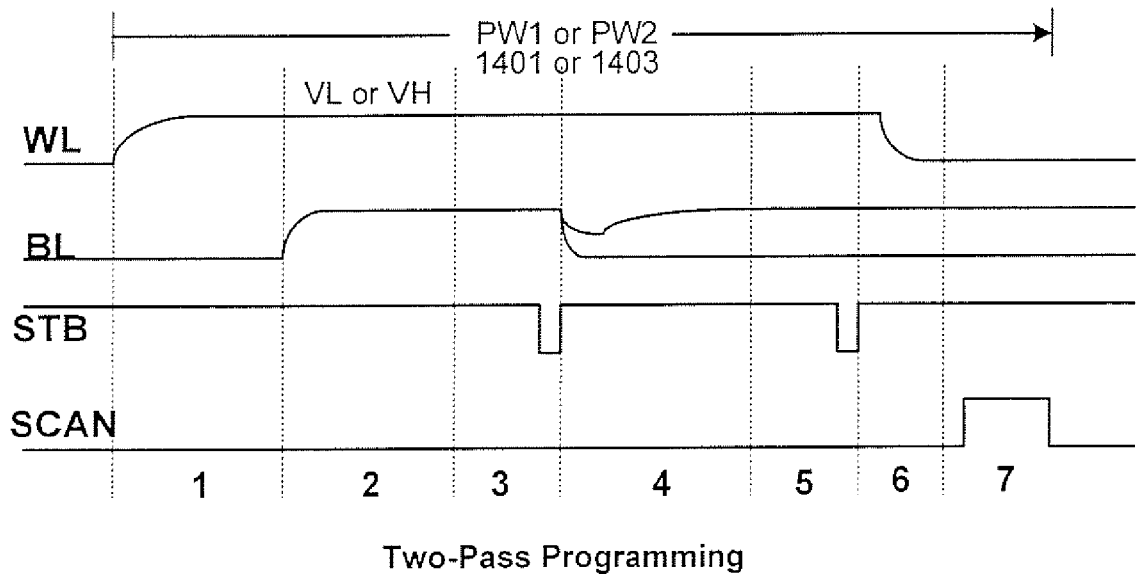
FIG. 13 is a timing diagram for sensing in the verify operation for a two-pass programming operation.

FIG. 13 is a timing diagram for sensing in the verify operation for a two-pass programming operation. First, the word line WL is precharged. This is followed by precharging the bit lines BL. When the precharged voltages are stable, a first strobe STB will sense the high conduction states of the memory cells and latch them. The bit lines of these high conduction states are latched to ground to prevent them from introducing source bias errors to the subsequent sensing. After the voltages in the bit lines have recovered to a stable state, the memory cells are sensed in a second strobe STB. Thereafter, the word line is discharged and ready for setting up to the next programming pulse. The sensed data is transferred to data latches when a SCAN signal is asserted. In the two pass-programming operation, the verify operation has WL set at VL during the first pass and then set at VH during the second pass.

Writing could be executed more quickly if it were possible to use a single pass with a single staircase of programming pulses, allowing for the distribution to be subjected to an initial programming phase based on a lower verify VL, but still be able to slow down the process once this initial level is reached and refine the distribution using the higher verify VH. This can be achieved through a "Quick Pass Write" that uses bit line bias to program in a single staircase sequence for the programming waveform. This algorithm can achieve a similar effect to that of a two-pass write and is described in more detail in U.S. Pat. No. 6,643,188.

Figure 14:
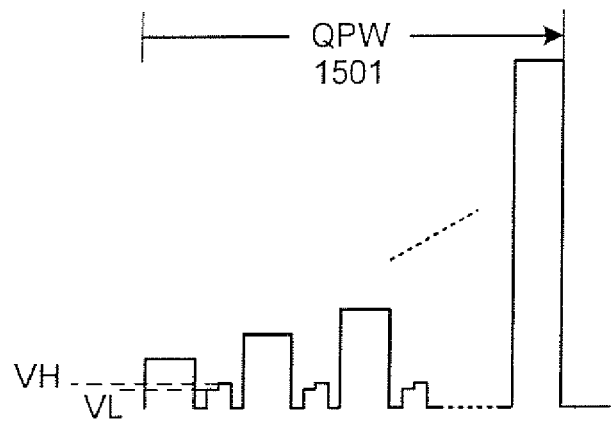
FIG. 14 shows the single-pass programming waveform of the Quick Pass Write.

FIG. 14 shows the single-pass programming waveform of the Quick Pass Write. The programming waveform QPW 1501 is similar to just the first phase of the two-pass algorithm, except that the verify operation is performed at both the VL and VH level (see the smaller two-step pulse in between each programming pulse.) However, once a verify at VL occurs, rather than restart the staircase waveform, the staircase continues, but with the bit line voltage raised to slow the programming rate as it continues until the cells verify at VH. This allows the pulses of the programming waveform to be monotonically non-decreasing as well as significantly shortening the program/verify cycles.

Figure 15:
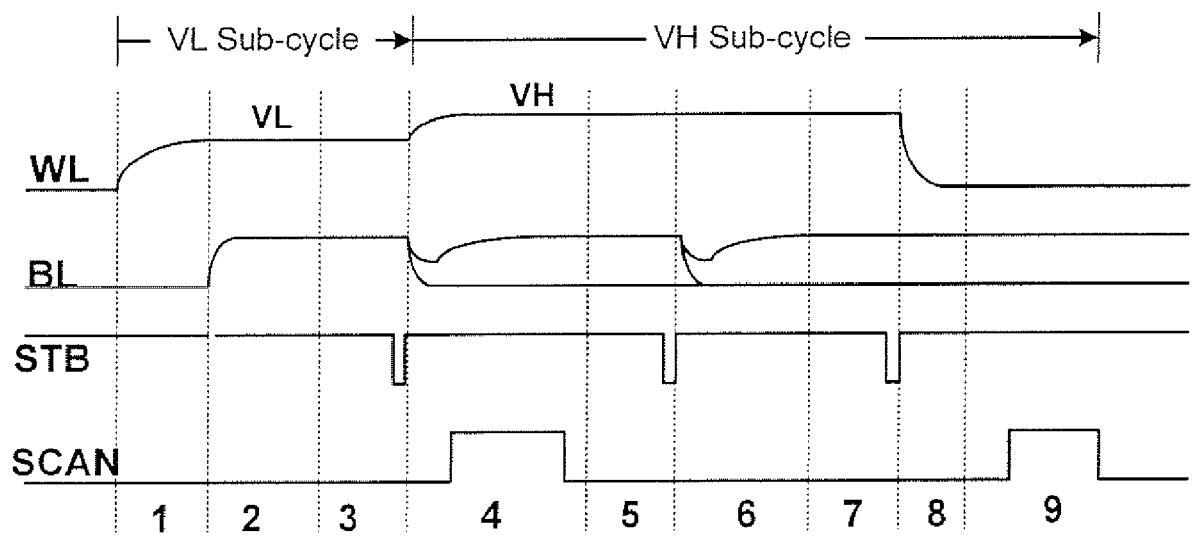
FIG. 15 is a timing diagram for sensing in the verify operation for a one-pass QPW programming operation.

FIG. 15 is a timing diagram for sensing in the verify operation for a one-pass QPW programming operation. First, the word line WL is precharged to VL. This is followed by precharging the bit lines BL. When the precharged voltages are stable, a VL strobe STB will sense the memory cells and latch them. The sense VL data is transferred to data latches when a first SCAN signal is asserted. Those cells that have successfully verify at VL with have their bit lines set to a voltage that will slow down the programming. Then the word line is raised to the level VH. After the precharged voltages have become stable, a first VH strobe STB will sense the memory cells and identifies the high conduction states of the memory cells and latch them. The bit lines of these high conduction states are latched to ground to prevent them from introducing source bias errors to the subsequent sensing. After the voltages in the bit lines have recovered to a stable state, the memory cells are sensed in a second VH strobe STB. Thereafter, the word line is discharged and ready for setting up to the next programming pulse. The sensed VH data is transferred to data latches when a second SCAN signal is asserted.

Smart Quick Pass Write ("SQPW")

The current Quick Pass Write (QPW) verify scheme combines the two separate individual VL and VH verify into one verify sequence. In this scheme WL is changing from VL to VH within the same verify sequence without discharging, and charging tip again, thereby saving time compared to the 2-pass programming scheme described in connection with FIG. 12 and FIG. 13. However, as can be seen from FIG. 15, each verify cycle always includes the VL sub-cycle and the VH sub-cycle.

According to the present invention, depending on the states of the memory cells being sensed during a program verify operation, a portion of the verify operation is recognized to be superfluous and skipped to save time. In a preferred embodiment, in a program verify operation on a group of memory cells being programmed in parallel and involving verifying relative to a given threshold level for demarcating between two memory states, the verify operation includes a sequence of two verify sub-cycles, the first sub-cycle performing a verify relative to a first threshold level at a predetermined margin below the given threshold level and the second sub-cycle performing a verify relative to a second threshold level which is identical to the given threshold level. However, unlike conventional cases, the second sub-cycle is not performed until any one memory cell of the group has been verified to pass the first threshold.

In a preferred embodiment, an operation, referred to as "One-bit-Pass" ("OBP") is performed at the end of the first sub-cycle to check for the event if any one memory cell of the group has been programmed past the first threshold level. In that event, the second sub-cycle would be appended as in subsequent verify cycles. Also, in subsequent verify cycles the OBP operation is not performed. Referring to FIG. 6D, each of the read/write stacks 490 serving the page of memory cells to be operated in parallel would have the sensed data in the sense amplifier 212 accumulated in the latch 520 serially. When the programmed state has a threshold level below the first threshold level it is at a logical "0". When any one of the sensed state is passed the first threshold level, it is at a logical "1". So the OBP operation has to merely check at end of the transfer to see if the latch has the value "0" or not. If at "0" the verify cycle continues to skip the second sub-cycle. Once a not "0" is detected, the second sub-cycle is appended, and in subsequent verify cycles, the OBP operation is no longer performed.

Figure 16:
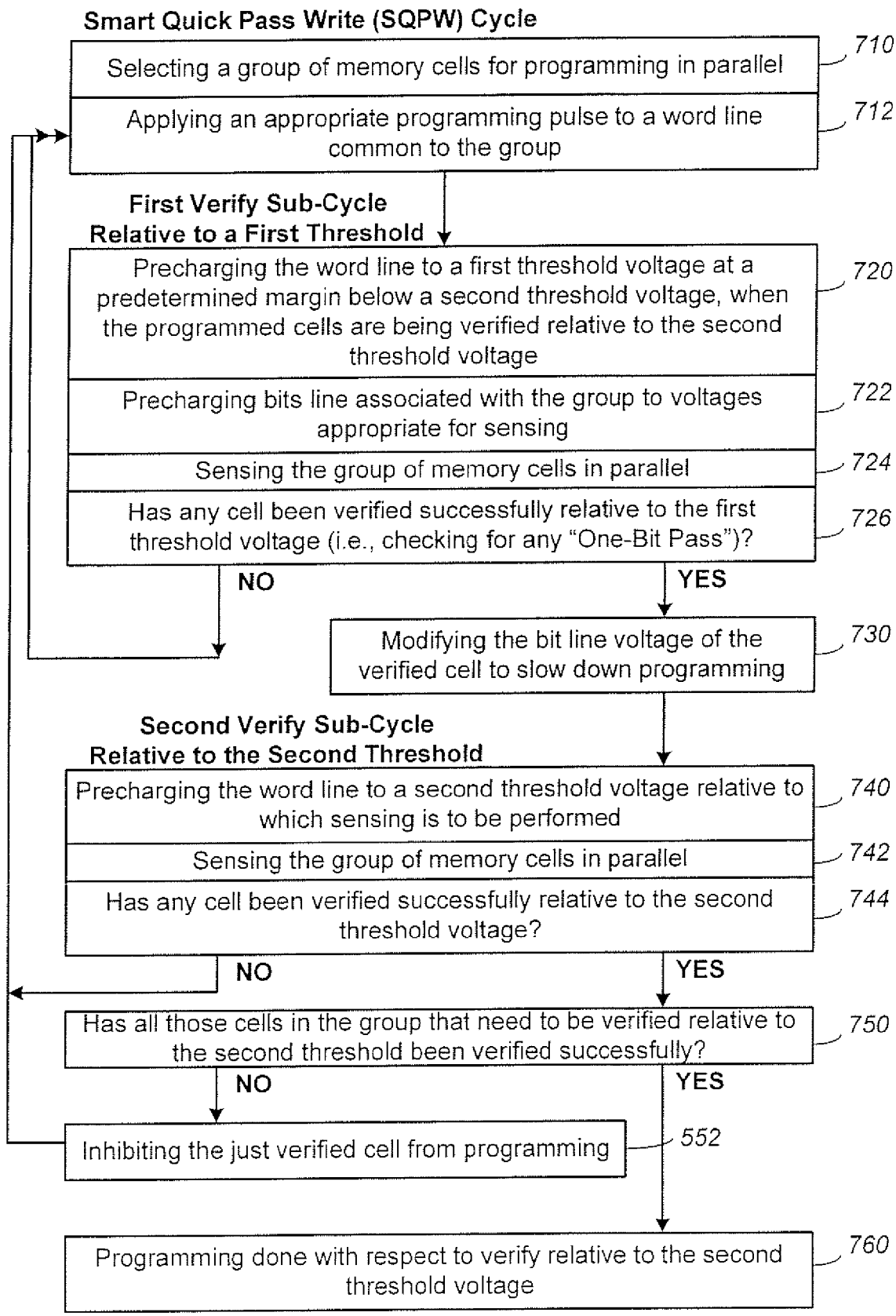
FIG. 16 is flowchart for an improved program verify operation, according to the present invention.

FIG. 16 is flowchart for an improved program verify operation, according to the present invention.

STEP 710: Selecting a group of memory cells for programming in parallel.

Program Cycle

STEP 712: Applying an appropriate programming pulse to a word line common to the group.

First Verify Sub-Cycle Relative to a First Threshold

STEP 720: Precharging the word line to a first threshold voltage at a predetermined margin below a second threshold voltage, when the programmed cells are being verified relative to the second threshold voltage.

STEP 722: Precharging bits line associated with the group to voltages appropriate for sensing.

STEP 724: Sensing the group of memory cells in parallel.

STEP 726: If any cell has been verified successfully relative to the first threshold voltage (i.e., checking for any "One-Bit Pass"), then proceed to Second Verify Sub-Cycle in STEP 730, otherwise skip the Second Sub-Cycle and proceed to the next program pulse in STEP 712.

Second Verify Sub-Cycle Relative to the Second Threshold

STEP 730: Modifying the bit line voltage of the verified cell to slow down programming.

STEP 740: Precharging the word line to a second threshold voltage relative to which sensing is to be performed.

STEP 742: Sensing the group of memory cells in parallel.

STEP 744: If any cell has been verified successfully relative to the second threshold voltage, then proceed to STEP 750, otherwise proceed to the next program pulse in STEP 712.

STEP 750: If all those cells in the group that need to be verified relative to the second threshold have been verified successfully, then proceed to STEP 760, otherwise proceed to STEP 752.

STEP 752: Inhibiting the just verified cell from programming; and proceed to the next program pulse in STEP 712.

STEP 760: Programming is done with respect to verify relative to the second threshold voltage.

The important feature here is that at the end of the first VL verify sub-cycle, if no cell in the group passes VL, the second VH verify sub-cycle will be superfluous. There is no need to waste time to sense, strobe and scan for VH data. Thus, the second VH verify sub-cycle is skipped as long, as no cell in the group passes VL, thereby realizing some time saving. In general the more level is the memory cell partitioned, the more will be the demand for precision programming, and the present SQPW verify scheme will be even more beneficial.

In a preferred embodiment, the present SQPW verify uses a one-bit-pass (OBP) scan operation to detect any bit pass VL after sensing and strobing, of VL data. If no bit passes VL, then it will go to the next program pulsing directly. If any bit passes VL, then it will go back to the normal VL scan and do the rest like the normal QPW. In the next verify pulse, the OBP scan operation will be skipped.

Figure 17:
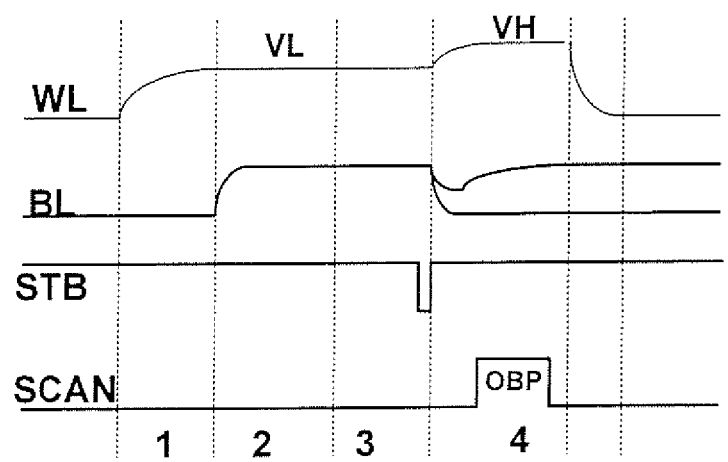
FIG. 17 is a timing chart for the SQPW verify before any bit passes VL. It can be regarded as a shortened cycle manifestation of the SPQW Verify and is applicable whenever no bit in the group of cells has passed VL.

FIG. 17 is a timing chart for the SQPW verify before any bit passes VL. It can be regarded as a shortened cycle manifestation of the SPQW Verify and is applicable whenever no bit in the group of cells has passed VL. It is essentially the VL Sub-cycle of the QPW shown in FIG. 15 but with the additional determination of whether any one bit passes VL, or (OBP) scan operation. The OBP scan operation takes place at the conclusion of the VL sub-cycle and the beginning of the VH sub-cycle as shown by the OBP waveform for the SCAN signal. It essentially detects if any one bit passes VL by checking the sense result relative to VL for the group of cells being programmed in parallel.

The sequence for the shortened cycle shown in FIG. 17 is as follows.

PHASE 1: Precharging the selected word line WL to VL

PHASE 2: Precharging the bit lines BL to voltages appropriate for sensing.

PHASE 3: Sensing and strobing (VL strobe) STB

PHASE 4: Changing the word line WL's voltage from VL to VH, after the bit lines voltages have recovered, performing OBP (One-bit Pass) to determine if any one bit has verified at VL.

If the OBP scan operation determines that no bit has passed VL, the shortened cycle is followed discharging the word line and the next programming pulse. If any bit passes VL in this shortened cycle, the cycle will be extended to become a full cycle with also verify at the VH level.

Figure 18:
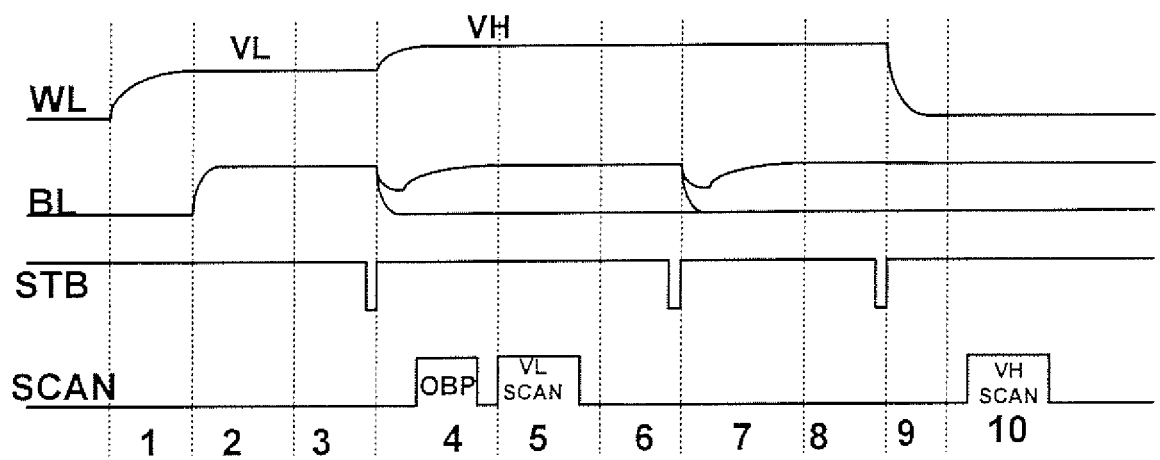
FIG. 18 is a timing chart for the SQPW verify where a first instance of a bit passing VL has just occurred.

FIG. 18 is a timing chart for the SQPW verify where a first instance of a bit passing VL has just occurred. It can be regarded as an extended cycle manifestation of the SPQW Verify and is applicable at the first occurrence of a bit in the group of cells passing the VL verify. It is essentially the VL Sub-cycle followed by an OBP scan operation and then further extended with the VH Sub-cycle of the QPW shown in FIG. 15.

The sequence for the extended cycle shown in FIG. 18 is as follows:

PHASES 1-4: Same as that of the shorten cycle shown in FIG. 17.

PHASE 5: Transferring sensed VL data to data latches (VL SCAN). Since WL charge tip that started in PHASE 4 takes a relatively longer time, it is desirable to perform the VL SCAN right after OBP detect any bit passes VL on the same verify sequence to save time.

PHASE 6: Sensing and strobing (VH 1$^{st}$ strobe). In the preferred embodiment, this is a preliminary quick sensing to detect the high current states so that they can be turned off in order not to interfere with a subsequence sensing.

PHASE 7: Allowing the bit lines BL to recover to appropriate voltages.

PHASE 8: Sensing and strobing (VH 2$^{nd}$ strobe)

PHASE 9: Discharging the word line WL.

PHASE 10: Transferring sensed VH data to data latches (VH SCAN).

Figure 19:
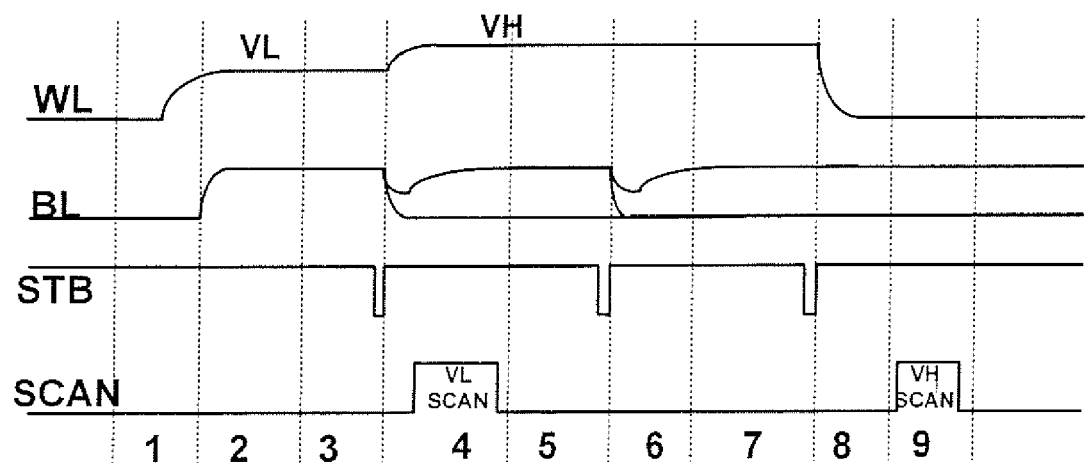
FIG. 19 is a timing chart for the SQPW verify in subsequent cycles following the cycle just after at least one bit has passes VL.

FIG. 19 is a timing chart for the SQPW verify, in subsequent cycles following the cycle just after at least one bit has passes VL. It can be regarded as a normal cycle manifestation of the SPQW Verify and is applicable in subsequent verify cycles following one that at least one bit in the group of cells has passed VL. It is essentially the normal Quick Pass Write verify with both the VL Sub-cycle and the VH Sub-cycle as shown in FIG. 15.

PHASE 1: Precharging the selected word line WL to VL

PHASE 2: Precharging the bit lines BL to voltages appropriate for sensing.

PHASE 3: Sensing and strobing (VL strobe) STB

PHASE 4: Changing the word line WL's voltage from VL to VH, and transferring sensed VL data to data latches (VL SCAN).

PHASE 5: Sensing and strobing (VH 1$^{st}$ strobe). In the preferred embodiment, this is a preliminary quick sensing to detect the high current states substantially below the VH level so that they can be turned off in order not to interfere with a subsequence sensing.

PHASE 6: Allowing the bit lines BL to recover to appropriate voltages.

PHASE 7: Sensing and strobing (VH 2$^{nd}$ strobe) for sensed VH data

PHASE 8: Discharging the word line WL.

PHASE 9: Transferring sensed VH data to data latches (VH SCAN).

Example of A-B-C Verify with SQPW

The description earlier for SQWP refers to program verify with respect to a given threshold level. The same principles essentially apply if there is more than one threshold level to be verified against. This can occur in programming multi-level memory, such as a 2-bit or 4-state memory that is demarcated by three threshold levels VA, VB and VC. For example, the programming of the upper page using the LM New code as shown in FIG. 9C will require program verify with respect to all three threshold levels.

In the preferred embodiment, the verify operations with respect to each of the three threshold levels can proceed serially with continuous sensing from lower to higher word line WL voltages. The program verify initially is relative to only VA, i.e., VerifyA. As the programming continues, when at least one bit have been programmed beyond VA, the program verify with have both VerifyA and VerifyB. Similarly, if at least one bit has been programmed beyond VB, the program verify with check all three thresholds levels with VerifyA, VerifyB and VerifyB. Similar smart verify schemes have been disclosed in U.S. Patent Publication No. 2004-0109362-A1. The entire disclosure of this publication is incorporated herein by reference.

Figure 20A:
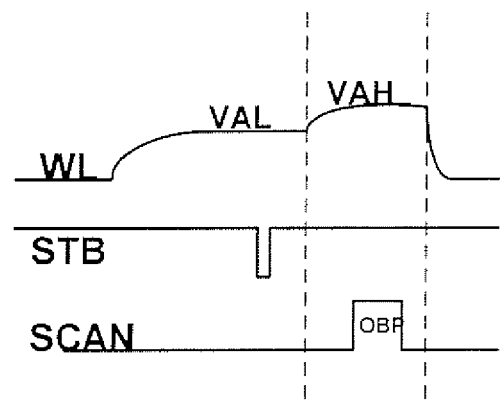
FIG. 20A is a timing chart of SQPW involving three threshold levels and shows the initial programming stage of involving only verifyA.

FIG. 20A is a timing chart of SQPW involving three threshold levels and shows the initial programming stage of involving only verifyA. Before any bit passes VAL, the shortened cycle shown in FIG. 17 applies with VL and VH being replaced by VAL and VAH respectively. At the first instance of a bit passing VAL after the OBP operation, then the sequence is same as the extended cycle shown in FIG. 18. Thereafter, the normal cycle of FIG. 19 applies. The time SQPW saves will be when the shortened cycle is in effect, which is the number of shortened cycle times (duration of normal cycle minus duration of shortened cycle) and the scan time difference between OBP and VL scan.

Figure 20B:
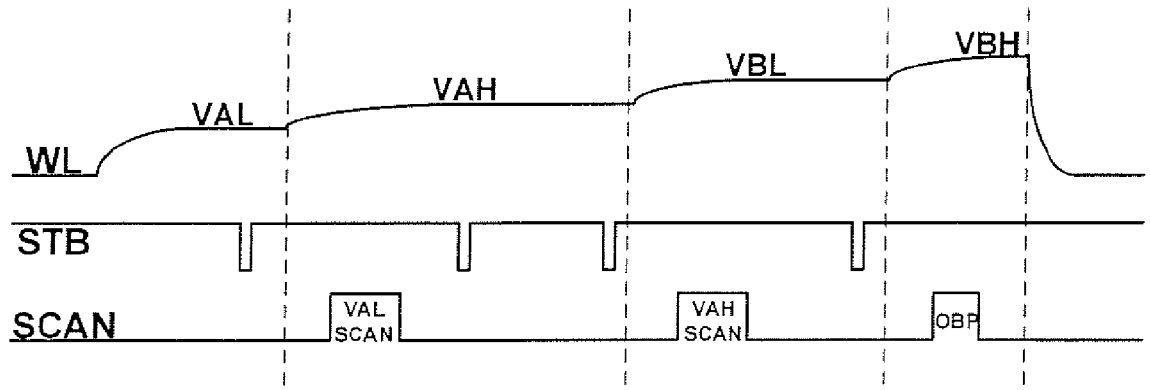
FIG. 20B is a timing chart of SQPW involving three threshold levels and shows the intermediate programming stage when verifyB is started in addition to verifyA.

FIG. 20B is a timing chart of SQPW involving three threshold levels and shows the intermediate programming stage when verifyB is started in addition to verifyA. Since at this stage at least one bit has already passed VAL, there is no need for the OBP operation to check for this event. The sensing at VAL and VAH simply follow a normal QPW verify cycle as shown in FIG. 19.

The sensing at VBL will initially likely be the shortened cycle as shown in FIG. 17. Again, if any bit passes VBL after OBP, then the VB verify is similar to the extended cycle shown in FIG. 18. Also, in the next sensing cycle, the normal cycle similar to that of FIG. 19 will resume. The time SQPW saves and wastes for verify at VB level will be calculated in similar manner to that for VA.

Figure 20C:
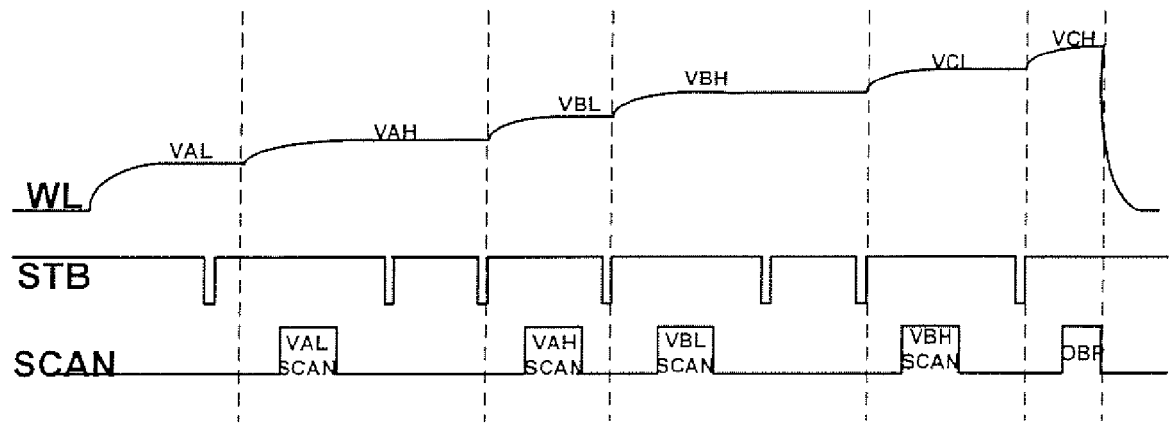
FIG. 20C is a timing chart of SQPW involving three threshold levels and shows the final programming stage when verifyC is started in additional to verifyA and verifyB.

FIG. 20C is a timing chart of SQPW involving three threshold levels and shows the final programming stage when verifyC is started in additional to verifyA and verifyB. Since at this stage at least one bit has already passed VAL, there is no need for the OBP operation to check for this event. Again, if any bit passes VCL after OBP, then the VC verify is similar to the extended cycle shown in FIG. 18. Also, in the next sensing cycle, the normal cycle similar to that of FIG. 19 will resume. The time SQPW saves and wastes for verify at VC level will be calculated in similar manner to that for the initial stage of program verify involving only verifyA, prior to any bit passing VAL.

Although the various aspects of the present invention have been described with respect to certain embodiments, it is understood that the invention is entitled to protection within the full scope of the appended claims.

What is claimed is:

1. A method of programming in parallel a group of memory cells relative to a demarcation threshold voltage, comprising:
    alternately applying a programming pulse and verifying the programmed result for the group of memory cells in parallel;
    said verifying further comprises:
    a first verify relative to a first reference threshold voltage at a predetermined margin below that of the demarcation threshold voltage;
    slowing the programming of the cell that has been verified relative to the first reference threshold voltage;
    a second verify relative to the demarcation threshold voltage; and
    inhibiting the memory cell that has been verified relative to the demarcation threshold voltage from further programming; and wherein:
    said second verify is skipped until at least one of the memory cells of the group has been verified relative to the first threshold voltage.

2. The method as in claim 1, further comprising:
    accessing the group of memory cells by associated bit lines; and wherein
    said slowing the programming includes raising a voltage on the bit line of the cell that has been verified to the first reference threshold voltage.

3. The method as in claim 1, further comprising:
    accessing the group of memory cells by associated bit lines;
    providing a supply voltage; and wherein
    said inhibiting a memory cell from further programming includes raising the bit lines associated with the memory cell substantially to the supply voltage while the cells not inhibited have their bit lines at substantially zero voltage.

4. The method as in claim 1, wherein said programming pulse is monotonically increasing with every pulse.

5. The method as in claim 1, wherein said group of memory cells is a portion of a flash EEPROM.

6. The method as in claim 1, wherein said group of memory cells is embodied in a memory card.

7. The method as in any one of claims 1-6, wherein individual memory cells are each programmable to one of two states and said demarcation threshold voltage is for demarcating the two states.

8. The method as in any one of claims 1-6, wherein individual memory cells are each programmable to one of more than two states and said demarcation threshold voltage is one of multiple demarcation threshold voltages for demarcating said more than two states.

9. The method as in any one of claims 1-6, wherein individual memory cells are each programmable to one of more than two states and said demarcation threshold voltage is one of multiple demarcation threshold voltages for demarcating said more than two states, and further comprising repeating all the steps relative to each of the multiple demarcation threshold voltages.

* * * * *